(12) United States Patent
Satou et al.

(10) Patent No.: US 11,088,308 B2
(45) Date of Patent: Aug. 10, 2021

(54) JUNCTION STRUCTURE

(71) Applicant: TDK CORPORATION, Tokyo (JP)

(72) Inventors: Takasi Satou, Tokyo (JP); Susumu Taniguchi, Tokyo (JP); Hideyuki Kobayashi, Tokyo (JP); Makoto Orikasa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/794,445

(22) Filed: Feb. 19, 2020

(65) Prior Publication Data

US 2020/0321499 A1    Oct. 8, 2020

Related U.S. Application Data

(60) Provisional application No. 62/809,884, filed on Feb. 25, 2019.

(51) Int. Cl.
  *H01L 33/62* (2010.01)
  *H01L 23/00* (2006.01)

(52) U.S. Cl.
  CPC .............. *H01L 33/62* (2013.01); *H01L 24/05* (2013.01); *H01L 24/13* (2013.01); *H01L 24/16* (2013.01); *H01L 24/81* (2013.01); *H01L 2224/0401* (2013.01); *H01L 2224/05655* (2013.01); *H01L 2224/05686* (2013.01); *H01L 2224/13109* (2013.01); *H01L 2224/13111* (2013.01); *H01L 2224/13113* (2013.01); *H01L 2224/13155* (2013.01); *H01L 2224/16502* (2013.01); *H01L 2224/81203* (2013.01); *H01L 2224/81805* (2013.01); *H01L 2924/052* (2013.01); *H01L 2924/12041* (2013.01); *H01L 2933/0066* (2013.01)

(58) Field of Classification Search
  CPC ......... H01L 33/62; H01L 24/05; H01L 24/13; H01L 24/16; H01L 24/81; H01L 2224/0401; H01L 2224/05655; H01L 2224/16502; H01L 2224/81203; H01L 2224/81805; H01L 2924/12041; H01L 2933/0066
  See application file for complete search history.

(56) References Cited

U.S. PATENT DOCUMENTS

| | | | |
|---|---|---|---|
| 5,611,481 A * | 3/1997 | Akamatsu ............ | H05K 3/3436 228/180.22 |
| 5,977,637 A | 11/1999 | Akamatsu et al. | |
| 6,608,381 B1 | 8/2003 | Akamatsu et al. | |

(Continued)

FOREIGN PATENT DOCUMENTS

| | | |
|---|---|---|
| JP | H08-031835 A | 2/1996 |
| JP | 2010-003878 A | 1/2010 |

(Continued)

*Primary Examiner* — Douglas W Owens
(74) *Attorney, Agent, or Firm* — Oliff PLC

(57) ABSTRACT

A bonding structure is a bonding structure which bonds a light emitting element and a substrate and includes a first electrode formed on the light emitting element, a second electrode formed on the substrate, and a bonding layer which bonds the first electrode and the second electrode, and the bonding layer contains a first bonding metal component and a second bonding metal component different from the first bonding metal component.

7 Claims, 14 Drawing Sheets

(56) References Cited

U.S. PATENT DOCUMENTS

| | | | |
|---|---|---|---|
| 2002/0050404 A1 | 5/2002 | Akamatsu et al. | |
| 2004/0209453 A1 | 10/2004 | Akamatsu et al. | |
| 2011/0048774 A1 | 3/2011 | Sato et al. | |
| 2015/0171281 A1 | 6/2015 | Nakabayashi et al. | |
| 2017/0200868 A1 | 7/2017 | Nakabayashi et al. | |
| 2018/0366615 A1* | 12/2018 | Kang | H01L 23/495 |

FOREIGN PATENT DOCUMENTS

| | | |
|---|---|---|
| JP | 2011-074484 A | 4/2011 |
| JP | 2015-115568 A | 6/2015 |
| TW | 201841382 A | 11/2018 |
| TW | 201903787 A | 1/2019 |

* cited by examiner

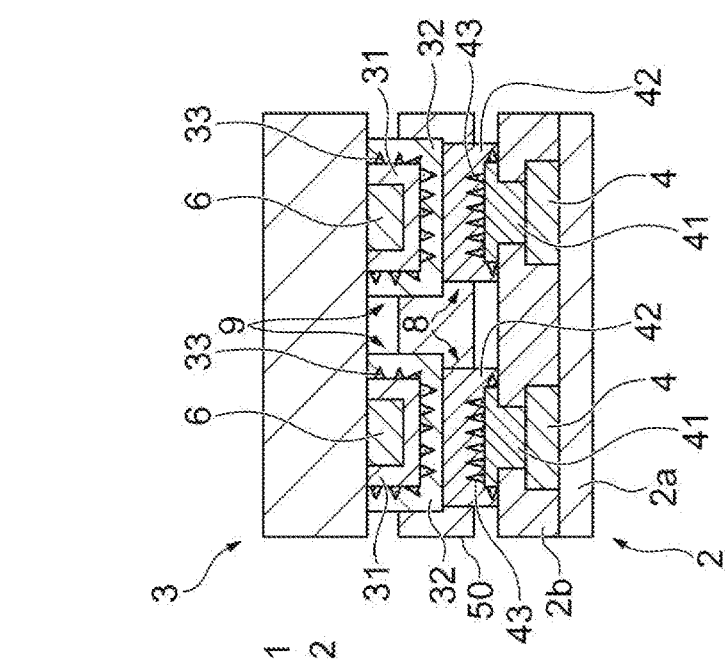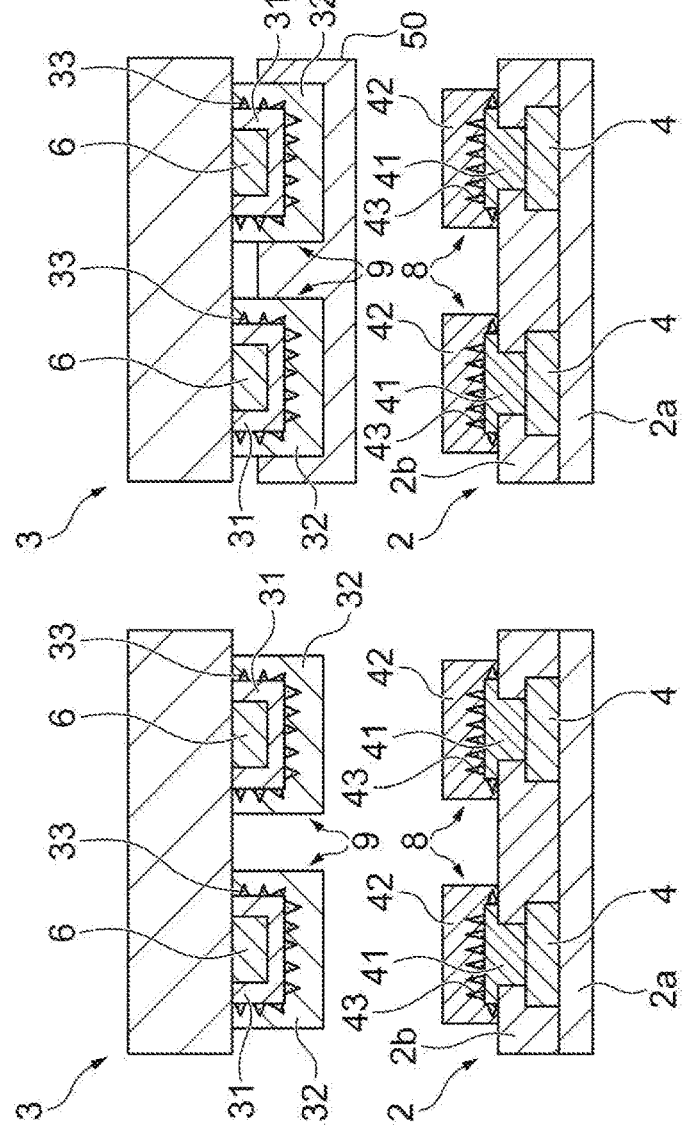

JUNCTION STRUCTURE

CROSS-REFERENCE TO RELATED APPLICATION

This application is a related application of U.S. Provisional Patent Application No. 62/809,884, filed Feb. 25, 2019, entitled "Junction Structure," and priority is claimed on this U.S. Provisional Patent Application under this provisional application under 35 U.S.C. 119.

TECHNICAL FIELD

The present invention relates to a bonding structure.

BACKGROUND

Conventionally, a technique described in Japanese Unexamined Patent Publication No. 2011-74484 is known as a bonding structure for bonding an electronic component to a substrate. In this bonding structure, the electronic component and the substrate are bonded by melting a solder which covers electrodes of the electronic component and a solder which covers electrodes of the substrate.

SUMMARY

Here, when a light emitting element and a substrate are bonded to each other, it is required to bond them in an appropriate state. Therefore, one aspect of the present invention provides a bonding structure in which a light emitting element and a substrate can be bonded in an appropriate state.

A bonding structure according to one aspect of the present invention is a bonding structure which bonds a light emitting element and a substrate and includes a first electrode formed on the light emitting element, a second electrode formed on the substrate, and a bonding layer which bonds the first electrode and the second electrode, and the bonding layer contains a first bonding metal component and a second bonding metal component different from the first bonding metal component.

The light emitting element and the substrate are bonded via the bonding layer. Further, the first electrode of the light emitting element and the second electrode of the substrate are electrically connected via the bonding layer. The bonding layer contains the first bonding metal component and the second bonding metal component different from the first bonding metal component. In this way, when the bonding layer contains the first bonding metal component and the second bonding metal component different from each other, a melting point at the time of bonding can be reduced. Accordingly, the light emitting element and the substrate can be bonded at a low temperature. As described above, the light emitting element and the substrate can be bonded in an appropriate state.

The bonding layer may have an alloy layer, and the alloy layer may be configured of an alloy of a foundation metal component and a bonding metal component of one of the first bonding metal component and the second bonding metal component.

The bonding layer may have a pair of alloy layers on a light emitting element side and a substrate side.

The bonding layer may have a metal layer formed substantially of a single metal component, and the metal layer may be formed of a bonding metal component of the other one of the first bonding metal component and the second bonding metal component.

The bonding layer may have a eutectic layer in which the first bonding metal component and the second bonding metal component are mixed.

The bonding layer may have a metal layer formed substantially of a single metal component, and a eutectic layer in which the first bonding metal component and the second bonding metal component are mixed, the metal layer may be formed of a metal component of at least one of the first bonding metal component and the second bonding metal component, and the eutectic layer may be formed around the metal layer.

The bonding layer may have a first foundational layer and a first alloy layer formed on a light emitting element side, and a second foundational layer and a second alloy layer formed on a substrate side, the first alloy layer may be configured of an alloy of a first foundation metal component of the first foundational layer and a bonding metal component of one of the first bonding metal component and the second bonding metal component, the second alloy layer may be configured of an alloy of a second foundation metal component of the second foundational layer and the bonding metal component of one of the first bonding metal component and the second bonding metal component, and one of the first alloy layer and the second alloy layer may be thinner than the other alloy layer.

the bonding layer may have a first foundational layer and a first alloy layer formed on a light emitting element side, and a second foundational layer and a second alloy layer formed on a substrate side, the first alloy layer may be configured of an alloy of a first foundation metal component of the first foundational layer and a bonding metal component of one of the first bonding metal component and the second bonding metal component, the second alloy layer may be configured of an alloy of a second foundation metal component of the second foundational layer and the one bonding metal component, and the first alloy layer and the second alloy layer may be formed radially from the first foundational layer and the second foundational layer.

According to the present invention, it is possible to provide a bonding structure in which a light emitting element and a substrate can be bonded in an appropriate state.

BRIEF DESCRIPTION OF THE DRAWINGS

FIGS. 6A, 6B and 6C are process diagrams showing a state when a light emitting element is bonded to a substrate.

DETAILED DESCRIPTION

Figure 1:
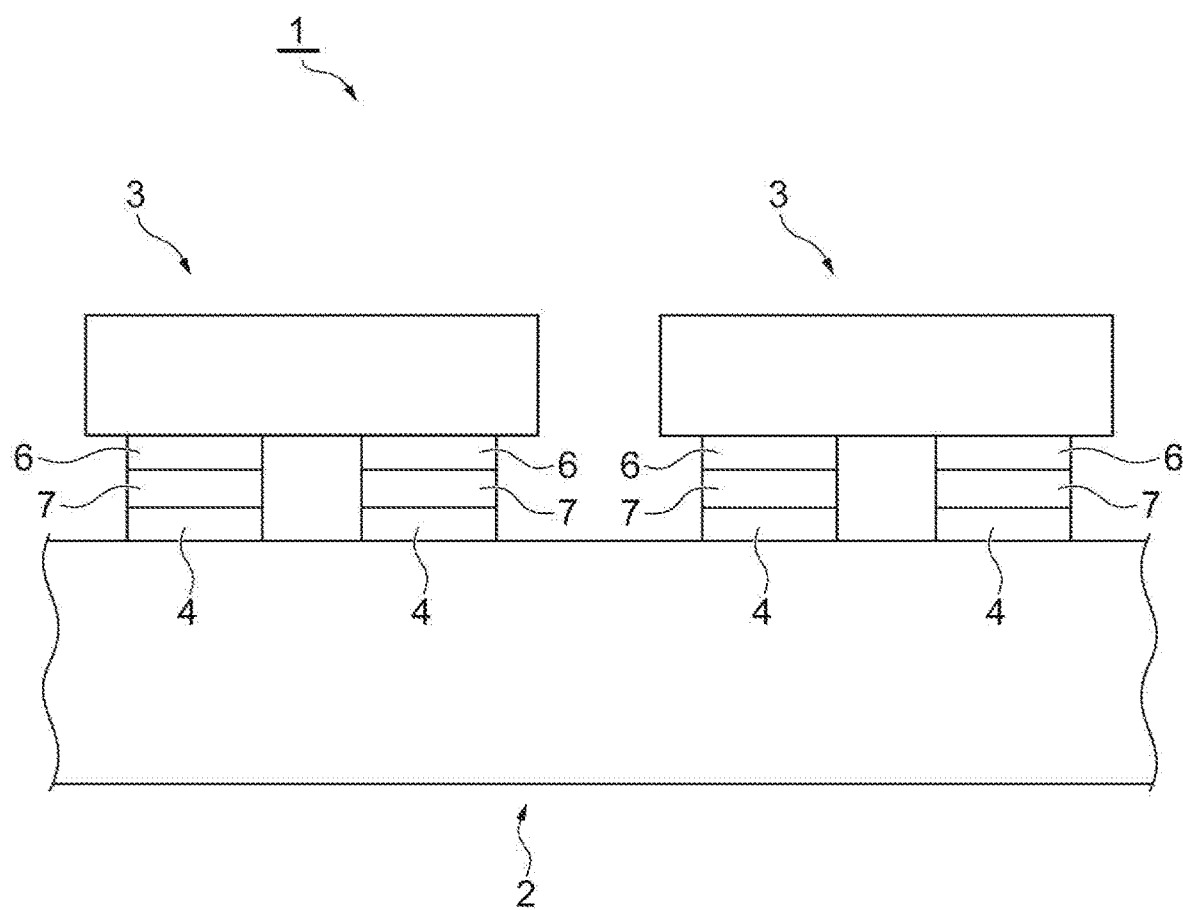
FIG. 1 is a schematic side view showing a bonding structure according to a first embodiment.

A first bonding metal component and a second bonding metal component may be any one metal of Sn, Bi, In, Pb, and Zn and may be an alloy or a eutectic composed of two or more metals of Sn, Bi, In, Pb, and Zn.

A concentration ratio of the first bonding metal component to the second bonding metal component in a bonding layer may be 0.1 to 9.0, 0.3 to 6.0, and 0.5 to 3.0.

A thickness of an alloy layer may be 0.1 µm or more, 0.3 µm or more, 0.5 µm or more and may be 2.0 µm or less, 1.5 µm or less, 1.0 µm or less.

At least one of a first alloy layer and a second alloy layer may be formed radially around a first foundational layer and a second foundational layer.

Hereinafter, preferred embodiments of a bonding structure according to one aspect of the present invention will be described in detail with reference to the drawings. In the following description, the same elements or elements having the same functions will be designated by the same reference numerals, and redundant description will be omitted.

First Embodiment

FIG. 1 is a schematic side view showing a bonding structure 1 according to a first embodiment. As shown in FIG. 1, the bonding structure 1 is configured by bonding a light emitting element 3 to a substrate 2. A plurality of electrodes 4 (second electrodes) are formed on the substrate 2. Electrodes 6 (first electrodes) are formed on the light emitting element 3. The electrodes 4 of the substrate 2 and the electrodes 6 of the light emitting element 3 are bonded via a bonding layer 7. As described above, the bonding structure 1 includes the electrodes 4 formed on the substrate 2, the electrodes 6 formed on the light emitting element 3, and the bonding layer 7 which bonds the electrodes 4 to the electrodes 6.

Figure 2:
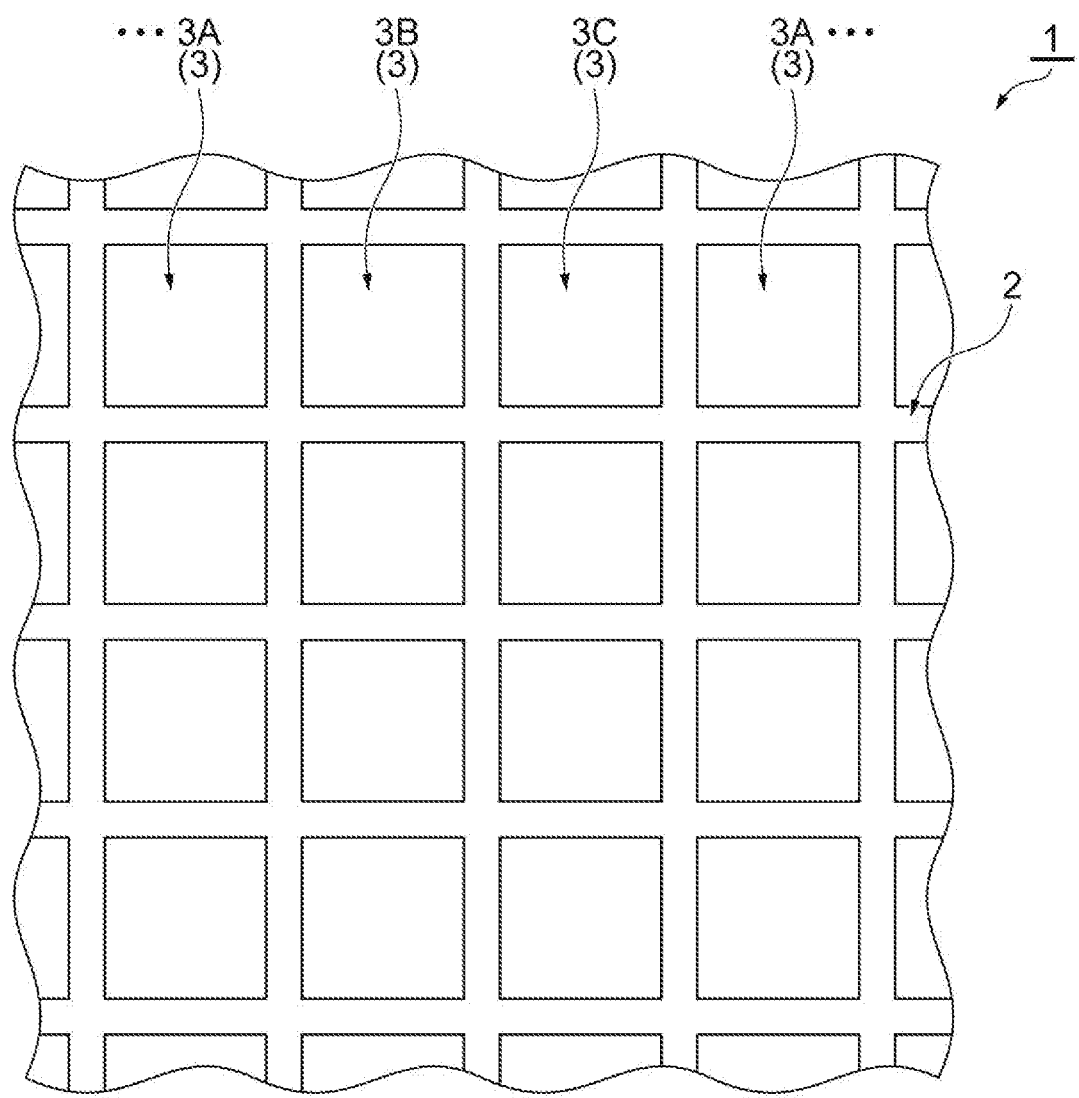
FIG. 2 is a schematic plan view showing the bonding structure according to the first embodiment.

FIG. 2 is a schematic plan view showing the bonding structure 1 according to the first embodiment. As shown in FIG. 2, the light emitting elements 3 are arranged in a matrix form on the substrate 2. A red light emitting element 3A, a green light emitting element 3B, and a blue light emitting element 3C are fixed to the substrate 2 in a predetermined arrangement pattern. The substrate 2 is not particularly limited and may be a flexible substrate. As described above, components of an LED display can be configured by bonding the plurality of light emitting elements 3 to the substrate 2. For example, in contrast to a method of controlling light of a backlight with a transmissive liquid crystal like a liquid crystal display (LCD), a light emitting element (LED) display forms a pixel with a light emitting element which is a natural light emitting element. Accordingly, the LED display has features such as high brightness, a long life, and a high viewing angle. In order to increase the number of pixels in such an LED display, a size of the light emitting element 3 is reduced.

The bonding layer 7 is formed by overlapping bumps formed on the electrodes 4 of the substrate 2 and bumps formed on the electrodes 6 of the light emitting element 3 and heating and melting the bumps. As shown in FIG. 6A, each of the bumps 8 formed on the electrodes 4 of the substrate 2 has a foundational layer 41 which covers the electrode 4 and a metal layer 42 which covers the foundational layer 41. Each of the bumps 9 formed on the electrodes 6 of the light emitting element 3 has a foundational layer 31 which covers the electrode 6 and a metal layer 32 which covers the foundational layer 31.

The metal layers 32 and 42 are made of a connection metal. Connection metals are metals which can be bonded to each other by melting, then cooling and hardening. Further, the metal layer 32 and the metal layer 42 are formed of mutually different bonding metals. The metal layer 32 is made of a first bonding metal. The metal layer 42 is made of a second bonding metal different from the first bonding metal. As a combination of such different bonding metals, a combination of Sn and Bi, a combination of Sn and In, or the like is employed.

The foundational layers 31 and 41 are layers called under bump metals (UBMs). The foundational layers 31 and 41 are layers interposed between the electrodes 6 and 4 and the metal layers 32 and 42 when the metal layers 32 and 42 are formed on the electrodes 6 and 4. Ni, NiP, NiB, Cu or the like is used as the foundational layers 31 and 41. The foundational layers 31 and 41 may be omitted, and the metal layers 32 and 42 may be formed directly on the electrodes 6 and 4. In addition, Cu, Ag, Al, Pd, Au, or the like is adopted as the electrodes 6 and 4. Since Pd and Au serve as a catalyst for electroless plating and can simplify a pretreatment process, they are suitable as electrode materials.

Figure 3:
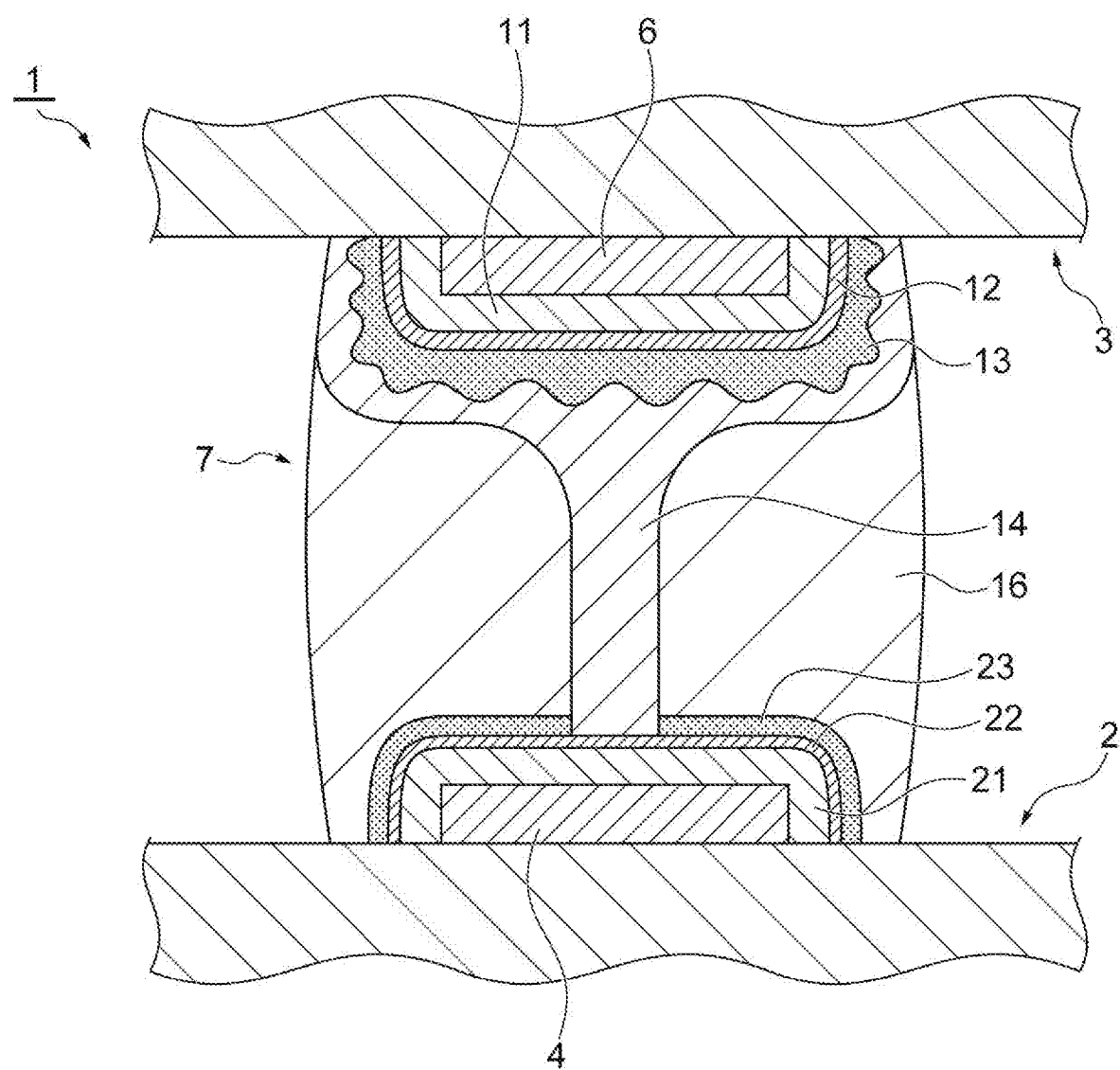
FIG. 3 is a schematic cross-sectional view of the bonding structure according to the first embodiment.

Next, the bonding layer 7 will be described in detail with reference to FIG. 3. FIG. 3 is a schematic cross-sectional view of the bonding structure 1. Here, the bonding structure 1 in which Cu is used as the electrode 4 of the substrate 2, NiP is used as the foundational layer 41, Bi is used as the bonding metal of the metal layer 42, Cu is used as the electrode 6 of the light emitting element 3, NiP is used as the foundational layer 31, and Sn is used as the bonding metal of the metal layer 32 will be described.

In the bonding layer 7, Sn is used as the first bonding metal on the light emitting element 3 side, and Bi is used as the second bonding metal on the substrate 2 side. Therefore, the bonding layer 7 contains a Sn component which is a first bonding metal component and a Bi component which is a second bonding metal component different from the first bonding metal component. A state in which the first bonding metal component and the second bonding metal component are contained indicates a state in which the first bonding metal and the second bonding metal are present as components in the bonding layer 7, regardless of whether the first bonding metal and the second bonding metal are present as eutectic layers, alloy layers, or single metal layers. Further, the bonding layer 7 has an alloy layer configured of an alloy of Ni as a foundation metal component and Sn as one of the bonding metal components.

Specifically, as shown in FIG. 3, the bonding layer 7 includes a NiP foundational layer 11, a P-containing layer 12, and a NiSn alloy layer 13 in that order from the electrode 6 side to cover the electrode 6 on the light emitting element 3 side. Further, the bonding layer 7 includes a NiP foundational layer 21, a P-containing layer 22, and a NiSn alloy layer 23 in that order from the electrode 4 side to cover the electrode 4 on the substrate 2 side. Furthermore, the bonding layer 7 has a Sn metal layer 14 and a Bi metal layer 16 between the NiSn alloy layer 13 on the light emitting element 3 side and the NiSn alloy layer 23 on the substrate 2 side.

The NiSn alloy layer 13 on the light emitting element 3 side is an alloy layer formed by a reaction between the Sn component of the metal layer 32 of the light emitting element 3 and a Ni component of the foundational layer 31. The NiSn alloy layer 13 is formed radially around the NiP foundational layer 11. That is, the NiSn alloy layer 13 has a locally largely protruding portion and a recessed portion. Such a radial shape of the NiSn alloy layer 13 is formed by annealing the metal layer 32 and the foundational layer 31 of the light emitting element 3 in advance (refer to FIG. 4D). The P-containing layer 22 is a layer formed by a reaction between the Sn component and the NiP component to form the NiSn alloy layer 13.

The NiSn alloy layer 23 on the substrate 2 side is an alloy layer formed by a reaction between the Ni component of the foundational layer 41 of the substrate 2 and the Sn component. The Sn component at this time reacts with the Ni component on the substrate 2 side by the Sn component on the light emitting element 3 side being diffused into the Bi component to the substrate 2 side. The Sn component on the substrate 2 side is smaller than that on the light emitting element 3 side. Therefore, the NiSn alloy layer 23 on the substrate 2 side is formed thinner than the NiSn alloy layer 13 on the light emitting element 3 side. Also, the P-containing layer 22 on the substrate 2 side is thinner than the P-containing layer 12 on the light emitting element 3 side. Since the NiSn alloy layer 23 on the substrate 2 side is a uniform and thin layer, the following effects can be obtained. When the substrate 2 is a flexible substrate, the alloy layer breaks easily due to an influence of stress applied to a terminal on the substrate 2 side. However, since the NiSn alloy layer 23 is uniform and thin, such breakage can be curbed.

The metal layer is a layer formed substantially of a single metal component. Here, the state in which the metal layer is formed by substantially a single metal component is a state in which the metal component is contained at 95% by mass or more in a unit volume. The bonding layer 7 has at least a metal layer formed of the bonding metal component of one of the first bonding metal component and the second bonding metal component which does not become the alloy layer. Since the NiSn alloy layers 13 and 23 are formed as the alloy layers, the bonding layer 7 has at least the Bi metal layer 16. In the embodiment, the bonding layer 7 also has the Sn metal layer 14 which is a metal layer of a Sn component serving as an alloy layer.

The Sn metal layer 14 and the Bi metal layer 16 are formed for the following reasons. That is, a NiSn alloy layer 33 is present in the Sn metal layer 32 at the time of starting the bonding by performing the annealing process in advance. Therefore, when the bonding is started, a reaction between the Sn component and the Bi component is inhibited by the Ni component diffused in the Sn component. Thus, the Sn component and the Bi component are not mixed uniformly. In this case, a Sn-rich portion partially remains, and that portion becomes the Sn metal layer 14. Further, a Bi-rich portion partially remains, and that portion becomes the Bi metal layer 16.

A narrow gap between the substrate 2 and the light emitting element 3 and a low fluidity of a bonded body may also cause the Sn component and the Bi component to be difficult to mix uniformly. For example, since a distance between the adjacent electrodes 6 in a planar direction is 100 μm or less, the gap between the substrate 2 and the light emitting element 3 may be suppressed to 50 μm or less from the viewpoint of preventing a short circuit.

Next, a method of manufacturing the bonding structure 1 will be described with reference to FIGS. 4 to 6. FIG. 4 is a process diagram showing a state when the bumps 9 are formed on the light emitting element 3 side. FIG. 5 is a process diagram showing a state when the bumps 8 are formed on the substrate 2 side. FIG. 6 is a process diagram showing a state when the light emitting element 3 is bonded to the substrate 2.

Figure 4A:
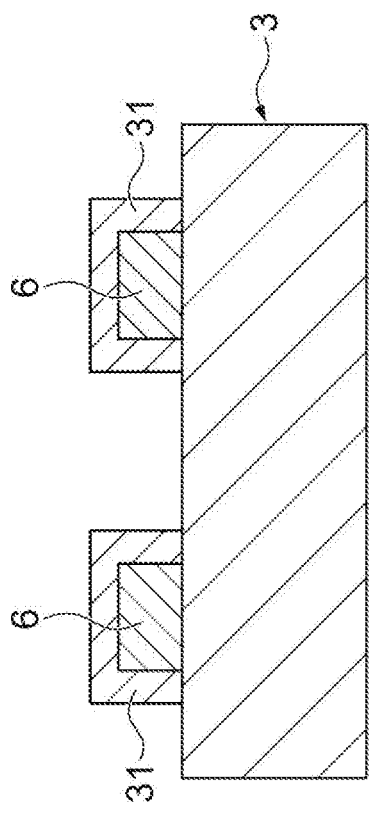
FIGS. 4A, 4B, 4C and 4D are process diagrams showing a state when a bump is formed on the light emitting element side.
Figure 4B:
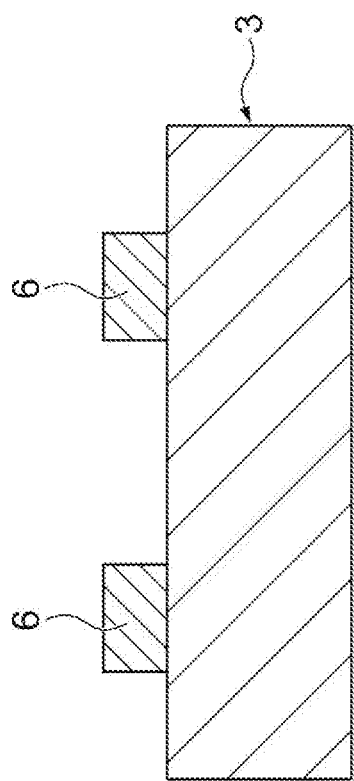
Figure 4C:
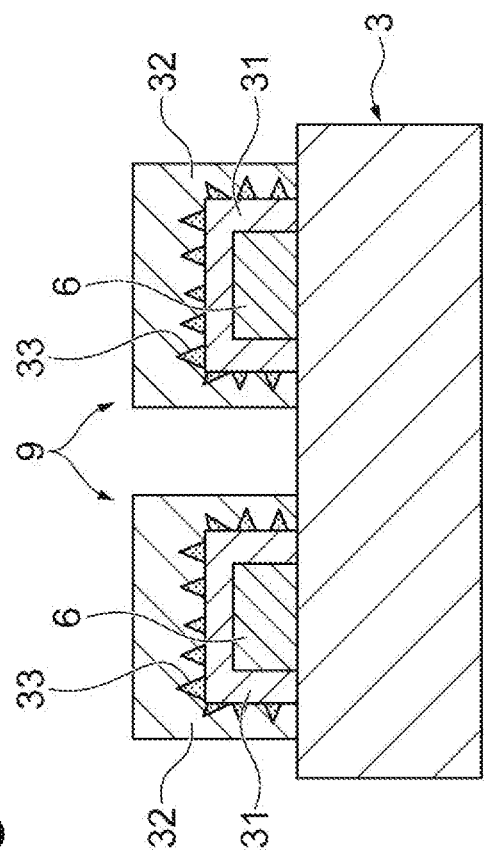
Figure 4D:
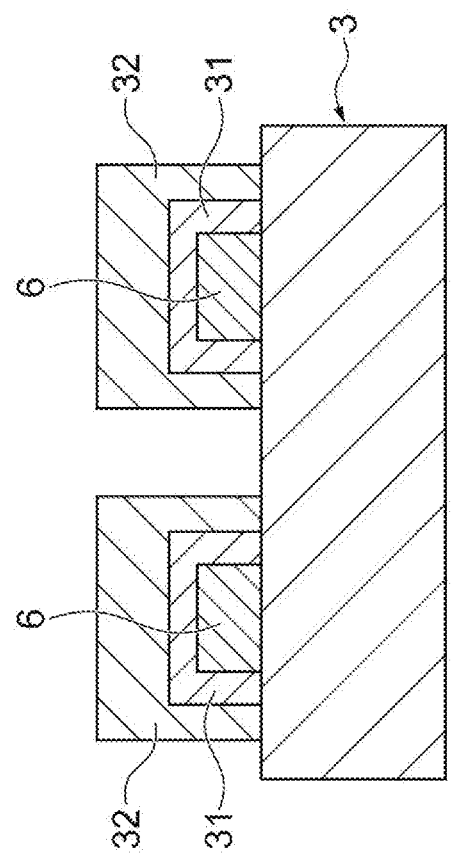

As shown in FIGS. 4A and 4B, the foundational layer 31 is formed by a plating method or the like to cover the electrodes 6 of the light emitting element 3. Next, as shown in FIG. 4C, the metal layer 32 is formed by a plating method or the like to cover the foundational layer 31. Next, as shown in FIG. 4D, the annealing process is performed. Thus, the foundational layer 31 and the metal layer 32 react with each other to form the alloy layer 33. The annealing process is performed at a temperature of about 100 to 300° C. Preferably, in order to suppress surface oxidation, the process is performed in a reducing atmosphere, vacuum, $N_2$ atmosphere, or the like. Further, the diffusion of the foundation metal component of the foundational layer 31 proceeds in the metal layer 32.

Dimensions after the annealing will be described. A thickness of the electrode 6 is set to 0.5 to 10 μm. A thickness of the foundational layer 31 is set to 0.5 to 10 μm. A thickness of the bump 9 is set to 0.5 to 10 μm. A thickness of the bump 9 is adjusted by changing a plating time.

Figure 5B:
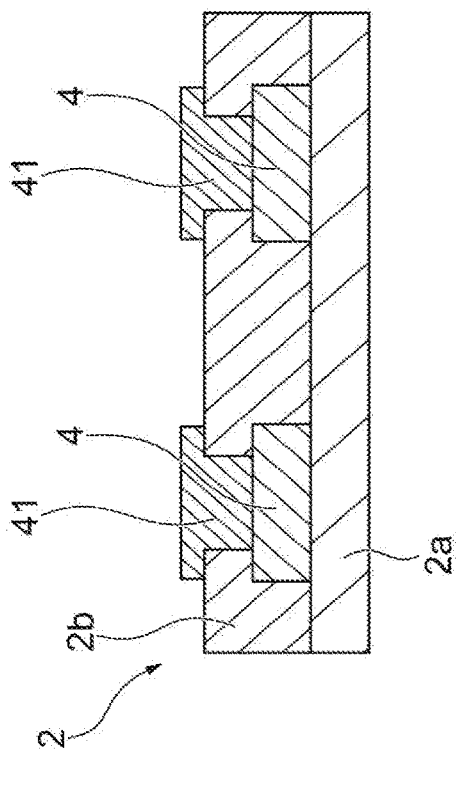
FIGS. 5A, 5B, 5C and 5D are process diagrams showing a state when a bump is formed on the substrate side.
Figure 5D:
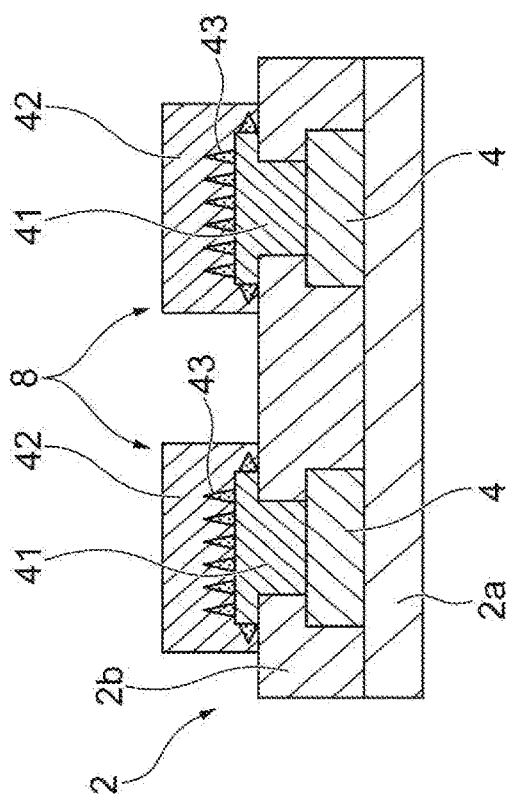
Figure 5A:
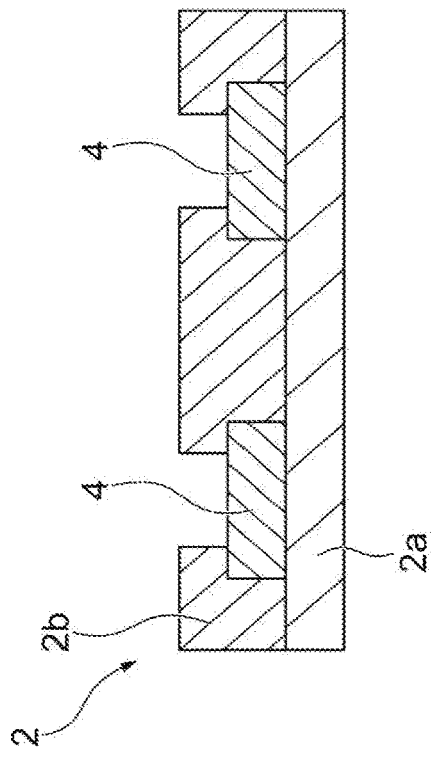
Figure 5C:
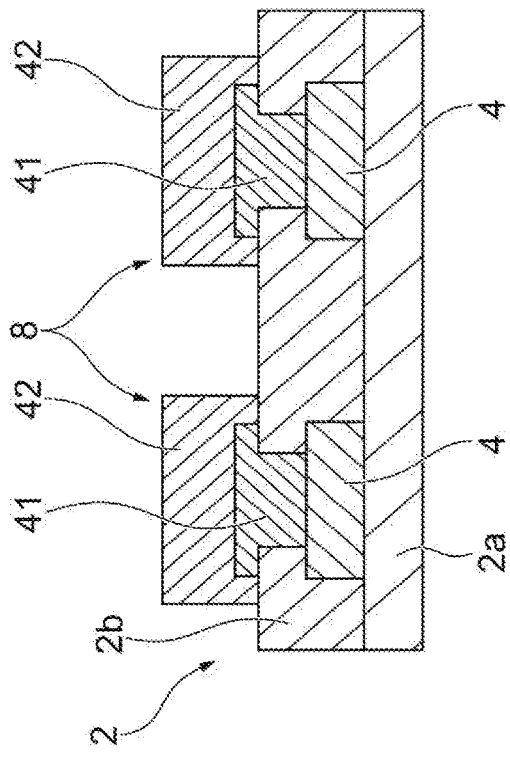

As shown in FIG. 5A, the electrodes 4 of the substrate 2 are exposed. The electrodes 4 are formed on a foundational material 2a, a groove is formed in a part of a coating layer 2b, and thus the electrodes 4 are exposed from the groove. As shown in FIG. 5B, the foundational layer 41 is formed by a plating method or the like to cover the electrodes 4. Further, as shown in FIG. 5C, the metal layer 42 is formed by a plating method or the like to cover the foundational layer 41. In this way, the bumps 8 of the substrate 2 are formed. Next, as shown in FIG. 5D, an annealing process is performed. As a result, the foundational layer 41 and the metal layer 42 react, and thus the alloy layer 43 is formed. The annealing process is performed at a temperature of about 100 to 300° C. Preferably, in order to curb surface oxidation, the annealing process is performed in a reducing atmosphere, vacuum, an $N_2$ atmosphere, or the like. Further, the diffusion of the foundation metal component of the foundational layer 41 proceeds in the metal layer 42.

A thickness of the electrode 4 is set to 0.5 to 10 pin. A thickness of the foundational layer 41 is set to 0.5 to 10 pin. A thickness of the bump 8 is set to 0.5 to 10 μm.

As shown in FIG. 6A, a position alignment between the substrate 2 and the light emitting element 3 is performed so that the bumps 8 of the substrate 2 and the bumps 9 of the light emitting element 3 face each other. As shown in FIG. 6B, a flux 50 is applied to the bumps 9 of the light emitting element 3. Next, as shown in FIG. 6C, the bumps 8 and 9 are brought into contact with each other, heat and pressure are applied thereto, and thus the bumps 8 of the substrate 2 and the bumps 9 of the light emitting element 3 are melted. The bonding layer 7 is formed by cooling and solidifying the melted bumps.

Next, an operation and effect of the bonding structure 1 according to the embodiment will be described.

The bonding structure 1 is a bonding structure 1 for bonding the light emitting element 3 and the substrate 2 and includes the electrodes 6 formed on the light emitting element 3, the electrodes 4 formed on the substrate 2, and the bonding layer 7 which bonds the electrodes 6 and the electrodes 4. The bonding layer 7 contains the first bonding metal component (here, the Sn component) and the second bonding metal component (here, the Bi component) different from the first bonding metal component.

The light emitting element 3 and the substrate 2 are bonded via the bonding layer 7. Also, the electrodes 6 of the light emitting element 3 and the electrodes 4 of the substrate 2 are electrically connected via the bonding layer 7. The bonding layer 7 contains the first bonding metal component and the second bonding metal component different from the first bonding metal component. As described above, when the bonding layer 7 contains the first bonding metal component and the second bonding metal component different from each other, a melting point at the time of bonding can be reduced. Accordingly, the light emitting element 3 and the substrate 2 can be bonded at a low temperature. In this way, the light emitting element 3 and the substrate 2 can be bonded in an appropriate state.

A size of the light emitting element 3 is much smaller than that of the substrate 2. Further, the substrate 2 on which the light emitting element 3 is mounted may be an organic substrate. Therefore, it is required to curb stress applied to a component mounting portion due to warpage or distortion due to heat. That is, the light emitting element 3 and the substrate 2 are required to be bonded at a low temperature. When the bonding structure 1 of the embodiment is adopted, the light emitting element 3 and the substrate 2 can be bonded at a low temperature.

The bonding layer 7 has the NiSn alloy layers 13 and 23. The NiSn alloy layers 13 and 23 are configured of an alloy of the Ni component which is a foundation metal component and the Sn component which is a bonding metal component of one of the first bonding metal component and the second bonding metal component. As described above, the fact that the bonding layer 7 has the NiSn alloy layers 13 and 23 indicates that the Ni component is diffused into the Sn metal layer when the bonding layer 7 is bonded. In this case, mixing of the Sn component and the Bi component is curbed, and the Sn metal layer 14 and the Bi metal layer 16 are easily formed.

In particular, the bonding layer 7 has a pair of alloy layers 13 and 23 on the light emitting element 3 side and the substrate 2 side. This means that at the time of bonding, the Sn component has moved to the substrate 2 having no the Sn metal layer 32 of the Sn component, and the NiSn alloy layer 23 has been formed. In this case, the Ni component on the substrate 2 side is also diffused into the Sn component, and thus the mixing of the Sn component and the Bi component can be further curbed. Further, on the substrate 2 side, instead of forming the eutectic layer by mixing the Sn component and the Bi component, the NiSn alloy layer 23 is formed by the Sn component and the Ni component. Thus, the bonding layer 7 can reduce a proportion of the eutectic layer which is brittle as a structure.

Here, the substrate 2 on which the light emitting element 3 is mounted may be reflowed again for repair or mounting of other components. The repair means replacing a defective light emitting element 3 with another light emitting element 3. In this case, when the bonding layer 7 is re-melted, the light emitting element 3 is displaced.

On the other hand, the bonding layer 7 has a metal layer formed of a substantially single metal component. This metal layer is the Bi metal layer 16 formed of the Bi component which is a bonding metal component of the other one of the first bonding metal component and the second bonding metal component. Further, in the embodiment, the bonding layer 7 also has the Sn metal layer 14. The metal layer formed of a substantially single metal component has a melting point equal to or higher than a reaction start temperature at the time of bonding. Therefore, when the reflow is performed again for repair, mounting of other components, or the like, remelting of the bonding layer 7 can be curbed.

The bonding layer 7 includes the NiP foundational layer 11 and the NiSn alloy layer 13 formed on the light emitting element 3 side, and the NiP foundational layer 21 and the NiSn alloy layer 23 formed on the substrate 2 side, the NiSn alloy layer 13 is made of an alloy of Ni of the NiP foundational layer 11 and Sn, the NiSn alloy layer 23 is made of an alloy of Ni of the NiP foundational layer 21 and Sn, and the NiSn alloy layer 23 is thinner than the NiSn alloy layer 13. When the substrate 2 is a flexible substrate, the alloy layer breaks easily due to an influence of stress applied to the terminals on the substrate 2 side. However, since the NiSn alloy layer 23 is uniform and thin, such breakage can be curbed. Such a NiSn alloy layer 23 on the substrate 2 side has a characteristic layer structure in which the NiSn alloy layer 23 is continuously diffused at a thickness of 1 μm or less.

The bonding structure 1 according to the above-described embodiment was manufactured as Example 1. Experimental conditions for obtaining the bonding structure according to the example will be described. First, a foundational layer of NiP having a thickness of 1 μm and a metal layer of Sn having a thickness of 6 μm were formed on an electrode having a size of φ15 μm in a light emitting element by a method called electroless plating. Further, the bump was heated by a formic acid reflow furnace, and thus the annealing process is performed. A foundational layer of NiP having a thickness of 1 μm and a metal layer of Bi having a thickness of 4 μm were formed on an electrode having a size of 15×20 μm in a substrate by a method called electroless plating. The light emitting element and the substrate were overlapped at a position of each of bumps, and pressure was applied while heated at 180° C.

Two bonding structures were manufactured under the same conditions in Example 1. In each of the bonding structures, the Sn metal layer 14 and the Bi metal layer 16 were confirmed. In addition, the NiSn alloy layer 13 which is diffused radially was confirmed. Also, the NiSn alloy layer 23 on the substrate side was confirmed.

Second Embodiment

Figure 7:
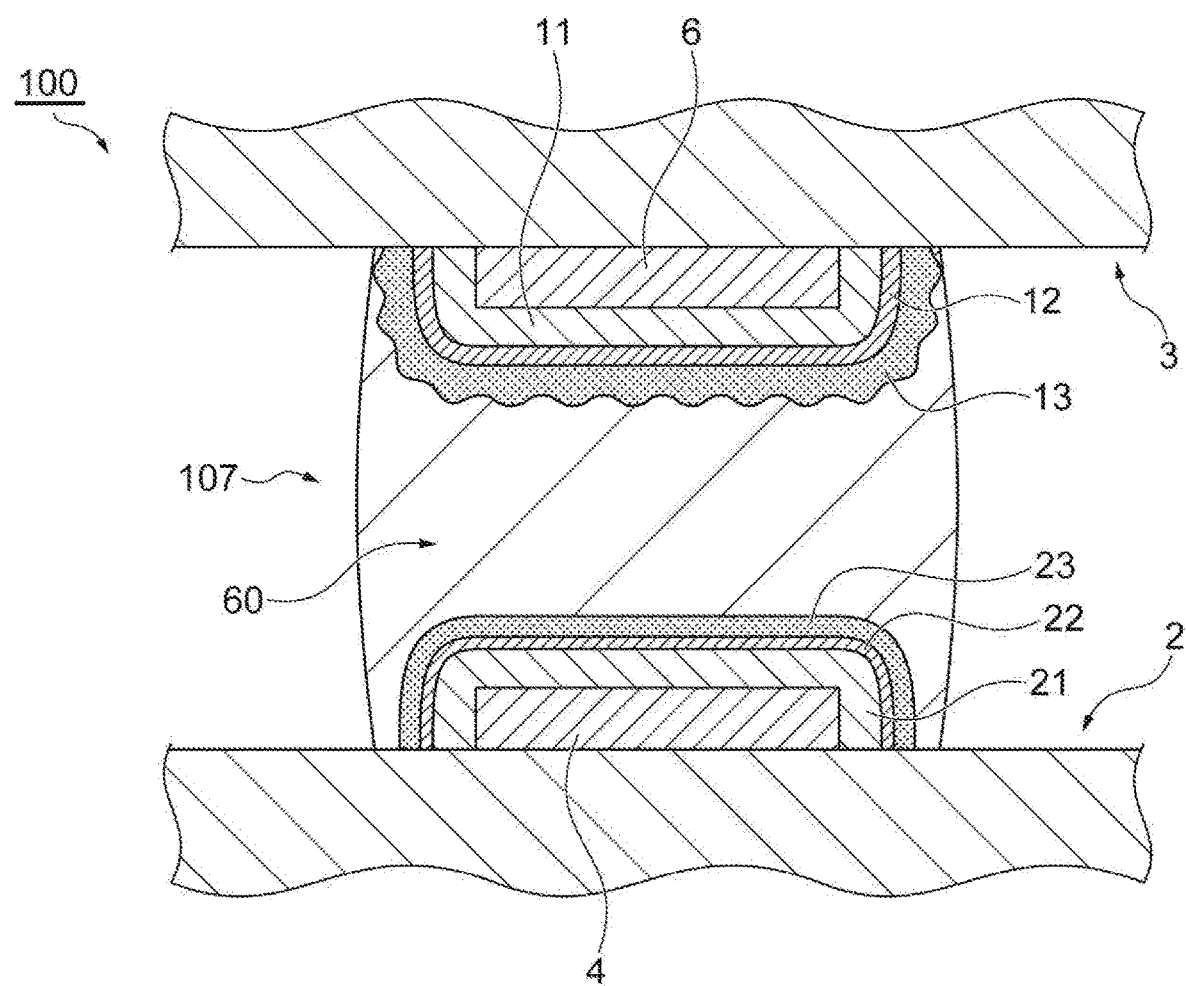
FIG. 7 is a schematic cross-sectional view showing a bonding structure according to a second embodiment.

A bonding structure 100 according to a second embodiment will be described with reference to FIG. 7. FIG. 7 is a schematic cross-sectional view of the bonding structure according to the second embodiment. A bonding layer 107 has a NiP foundational layer 11, a P-containing layer 12, and a NiSn alloy layer 13 in that order from the electrode 6 side to cover the electrodes 6 on the light emitting element 3 side. Further, the bonding layer 107 includes a NiP foundational layer 21, a P-containing layer 22, and a NiSn alloy layer 23 in that order from the electrode 4 side to cover the electrodes 4 on the substrate 2 side. Furthermore, the bonding layer 107 has a SnBi eutectic layer 60 between the NiSn alloy layer 13 on the light emitting element 3 side and the NiSn alloy layer 23 on the substrate 2 side.

The SnBi eutectic layer 60 is a layer in which a Sn component and a Bi component are mixed. At the time of bonding, the Sn component and the Bi component are substantially uniformly mixed with each other, and thus the SnBi eutectic layer 60 is formed. A melting point of the SnBi eutectic layer 60 is lower than that of each of the Sn metal layer 14 and the Bi metal layer 16 (refer to FIG. 3).

Such a SnBi eutectic layer 60 is formed by bonding the light emitting element 3 and the substrate 2 without performing an annealing process as shown in FIG. 4D when the bumps 9 of the light emitting element 3 are formed. That is, as shown in FIG. 4C, in a state in which the NiSn alloy layer 33 is not present in the metal layer 32 of Sn, the bumps 9 of the light emitting element 3 and the bumps 8 of the substrate 2 are bonded. In this case, diffusivity of the Ni component to the Sn component during bonding is lower than that of the first embodiment in which the NiSn alloy layer 33 is present in advance. Therefore, the Sn component and the Bi component are mixed, and the SnBi eutectic layer 60 is formed.

Since the SnBi eutectic layer 60 is formed, the Sn component mixed with the Bi component also moves to the substrate 2 side. On the other hand, an alloying reaction does not proceed between the Bi component and the NiP foundational layer 21. Therefore, the alloying reaction proceeds between the NiP foundational layer 21 on the substrate 2 side and the Sn component. The NiSn alloy layer 23 and the P-containing layer 22 are formed to cover the NiP foundational layer 21 on the substrate 2 side. Also in the bonding structure 100 according to the second embodiment, the NiSn alloy layer 23 on the substrate 2 side is a uniform and thin layer as compared with the NiSn alloy layer 13 on the light emitting element 3 side. This is because an alloy layer of Ni and Sn is formed after Bi is replaced with Sn. Therefore, even when the substrate 2 is a flexible substrate, the NiSn alloy layer 23 is uniform and thin, and thus it is possible to curb the breakage due to the stress.

As described above, the bonding structure 100 is a bonding structure 100 which bonds the light emitting element 3 and the substrate 2 and includes the electrodes 6 formed on the light emitting element 3, the electrodes 4 formed on the substrate 2, and the bonding layer 107 which bonds the electrodes 6 and the electrodes 4. The bonding layer 107 contains a first bonding metal component (here, a Sn component) and a second bonding metal component (here, a Bi component) different from the first bonding metal component.

When the bonding layer 107 contains the first bonding metal component and the second bonding metal component different from each other, a melting point at the time of bonding can be reduced. Thus, the light emitting element 3 and the substrate 2 can be bonded at a low temperature. In this way, the light emitting element 3 and the substrate 2 can be bonded in an appropriate state.

The bonding layer 107 has the NiSn alloy layers 13 and 23. The NiSn alloy layers 13 and 23 are configured of an alloy of the Ni component which is a foundation metal component and the Sn component which is a bonding metal component of one of the first bonding metal component and the second bonding metal component. The bonding layer 107 can reduce a proportion of the eutectic layer which is brittle as a structure by forming the NiSn alloy layers 13 and 23 in this manner. In particular, the bonding layer 107 has a pair of alloy layers 13 and 23 on the light emitting element 3 side and the substrate 2 side. This means that at the time of bonding, the Sn component has moved to the substrate 2 side having no the metal layer 32 of the Sn component, and the NiSn alloy layer 23 has been formed. In this way, on the substrate 2 side, instead of forming the eutectic layer by mixing the Sn component and the Bi component, the NiSn alloy layer 23 is formed by the Sn component and the Ni component. Thus, the bonding layer 107 can reduce a proportion of the eutectic layer which is brittle as a structure.

The bonding layer 107 has the SnBi eutectic layer 60 in which the Sn component and the Bi component are mixed.

The bonding structure 100 according to the second embodiment was manufactured as Example 2. Here, the conditions were the same as in Example 1 corresponding to the first embodiment except that the annealing process was not performed when the bumps of the light emitting element are formed. A pressing load of the light emitting element 3 against the substrate 2 is 0.05 g per chip.

In Example 2, it was confirmed that the SnBi eutectic layer 60 was formed. Further, it was confirmed that the NiSn alloy layer 13 which is diffused radially was formed at a boundary of the SnBi eutectic layer 6 on the light emitting element 3 side. Furthermore, it was confirmed that the NiSn alloy layer 23 was formed at a boundary of the SnBi eutectic layer 6 on the substrate 2 side.

Third Embodiment

Figure 8:
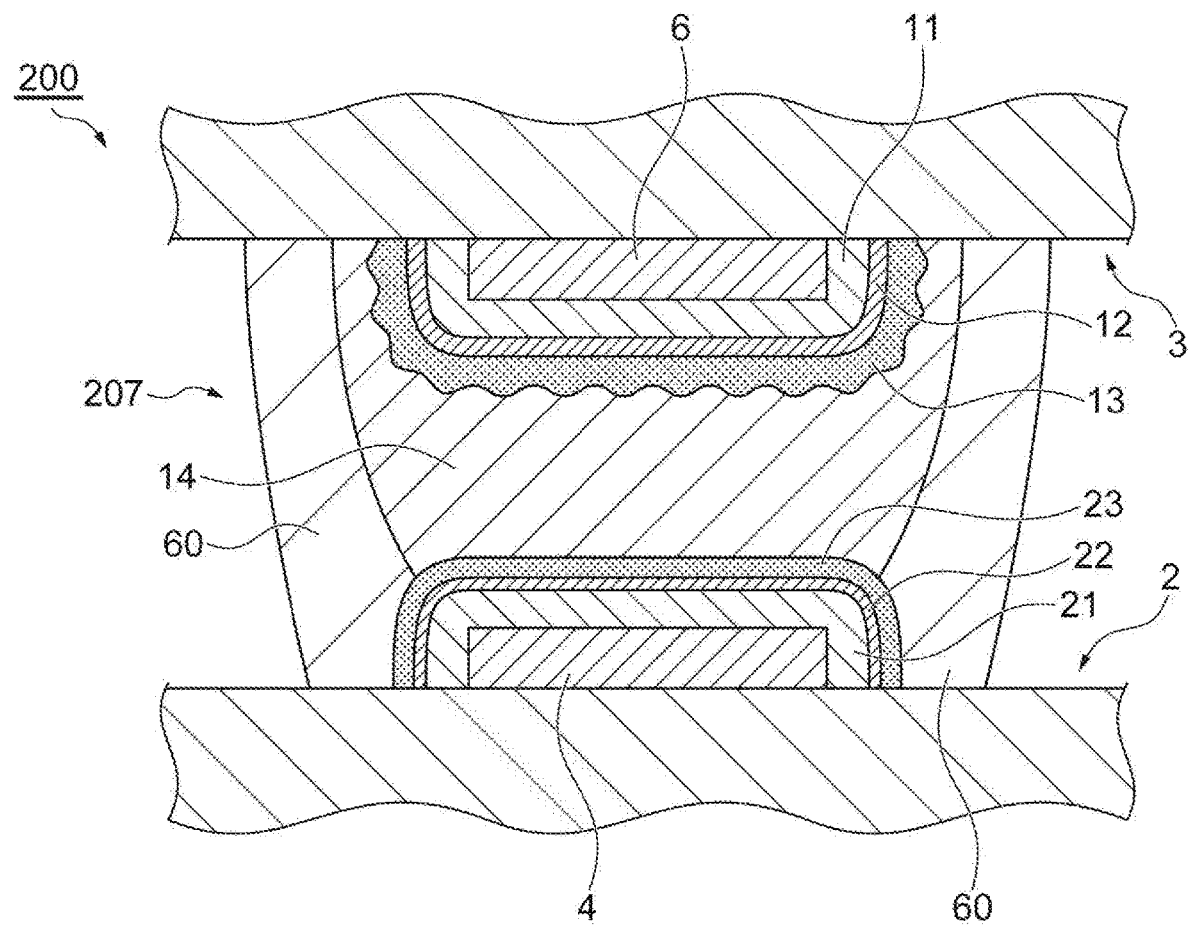
FIG. 8 is a schematic cross-sectional view showing a bonding structure according to a third embodiment.

A bonding structure 200 according to a third embodiment will be described with reference to FIG. 8. FIG. 8 is a schematic cross-sectional view of the bonding structure 200 according to the third embodiment. A bonding layer 207 includes a NiP foundational layer 11, a P-containing layer 12, and a NiSn alloy layer 13 in that order from the electrode 6 side to cover the electrode 6 on the light emitting element 3 side. Further, the bonding layer 207 includes a NiP foundational layer 21, a P-containing layer 22, and a NiSn alloy layer 23 in that order from the electrode 4 side to cover the electrode 4 on the substrate 2 side. In addition, the bonding layer 207 has a Sn metal layer 14 and a SnBi eutectic layer 60 between the NiSn alloy layer 13 on the light emitting element 3 side and the NiSn alloy layer 23 on the substrate 2 side.

The Sn metal layer 14 is mainly formed in a region in which the electrode 4 and the electrode 6 face each other. Then, the SnBi eutectic layer 60 is formed around the Sn metal layer 14. That is, the SnBi eutectic layer 60 is disposed to be pushed out to an outer peripheral portion of the bonding layer 207 by the Sn metal layer 14. In the embodiment shown in FIG. 8, since the Sn component is dominant, the Sn metal layer 14 is formed. However, according to a relationship between amounts of the Sn component and the Bi component, the Bi metal layer 16 may be formed instead of the Sn metal layer 14, or both the Sn metal layer 14 and the Bi metal layer 16 may be formed.

Such a bonding layer 207 is formed by increasing a pressing pressure of the light emitting element 3 against the substrate 2 with respect to the manufacturing conditions of the bonding structure 100 according to the second embodiment. For example, the pressing load per chip in the second embodiment is 0.001 to 1 g, preferably 0.01 to 0.06 g, while the pressing load per chip in the third embodiment is set to 1 to 10 g, preferably 2 to 8 g. Accordingly, at the time of bonding, a liquid layer portion in which the Sn component and the Bi component are mixed is pushed out to the outer peripheral portion by being pushed by the Sn metal layer before mixed with the Bi component. When the bonding layer 207 is cooled and solidified, the SnBi eutectic layer 60 is formed around the Sn metal layer 14. A distance between the light emitting element 3 and the substrate 2 may be controlled to be constant by inserting a spacer having a predetermined thickness between the light emitting element 3 and the substrate 2. As a material of the spacer, a material having high heat resistance and high dimensional processing accuracy, such as Si, SUS, or resin (PEEK, or the like) is preferable.

As described above, the bonding structure 200 is a bonding structure 200 which bonds the light emitting element 3 and the substrate 2 and includes the electrodes 6 formed on the light emitting element 3, the electrodes 4 formed on the substrate 2, and the bonding layer 207 which bonds the electrodes 6 and the electrodes 4. The bonding layer 207 contains a first bonding metal component (here, a Sn component) and a second bonding metal component (here, a Bi component) different from the first bonding metal component.

When the bonding layer 207 contains the first bonding metal component and the second bonding metal component different from each other, a melting point at the time of bonding can be reduced. Thus, the light emitting element 3 and the substrate 2 can be bonded at a low temperature. In this way, the light emitting element 3 and the substrate 2 can be bonded in an appropriate state.

The bonding layer 207 has the NiSn alloy layers 13 and 23. The NiSn alloy layers 13 and 23 are configured of an alloy of the Ni component which is a foundation metal component and the Sn component which is a bonding metal component of one of the first bonding metal component and the second bonding metal component. Also in the bonding structure 200 according to the third embodiment, the NiSn alloy layer 23 on the substrate 2 side is a uniform and thin layer as compared with the NiSn alloy layer 13 on the light emitting element 3 side. This is because an alloy layer of Ni and Sn is formed after Bi is replaced with Sn. Therefore, even when the substrate 2 is a flexible substrate, the NiSn alloy layer 23 is uniform and thin, and thus it is possible to curb the breakage due to stress.

The bonding layer 207 has a metal layer formed of a substantially single metal component, and an eutectic layer in which the first bonding metal component and the second bonding metal component are mixed. The metal layer is formed as the Sn metal layer 14 by the Sn component which is a metal component of at least one of the first bonding metal component and the second bonding metal component. The SnBi eutectic layer 60 is formed around the Sn metal layer 14. In this case, in the bonding layer 207, the SnBi eutectic layer 60 which has a low melting point and is brittle can be disposed on the outer peripheral side, and the Sn metal layer 14 which has a high melting point and high strength can be disposed on the center side as a main body portion. As described above, since the bonding layer 207 has the Sn metal layer 14 as the main body portion, when the reflow is performed again for repair, mounting of other components, or the like, remelting can be curbed, and reliability of the structure can be increased.

The bonding structure 200 according to the third embodiment was manufactured as Example 3. Here, the same conditions when the joint structure of Example 2 was formed were used except that the pressing load of the light emitting element 3 against the substrate 2 was 4 g per chip.

In Example 3, it was confirmed that the Sn metal layer 14 was formed in the vicinity of the center, and the SnBi eutectic layer 60 was formed around the Sn metal layer 14. In addition, the NiSn alloy layer 13 which is diffused radially was confirmed. Further, the NiSn alloy layer 23 on the substrate 2 side was confirmed.

Fourth Embodiment

Figure 9:
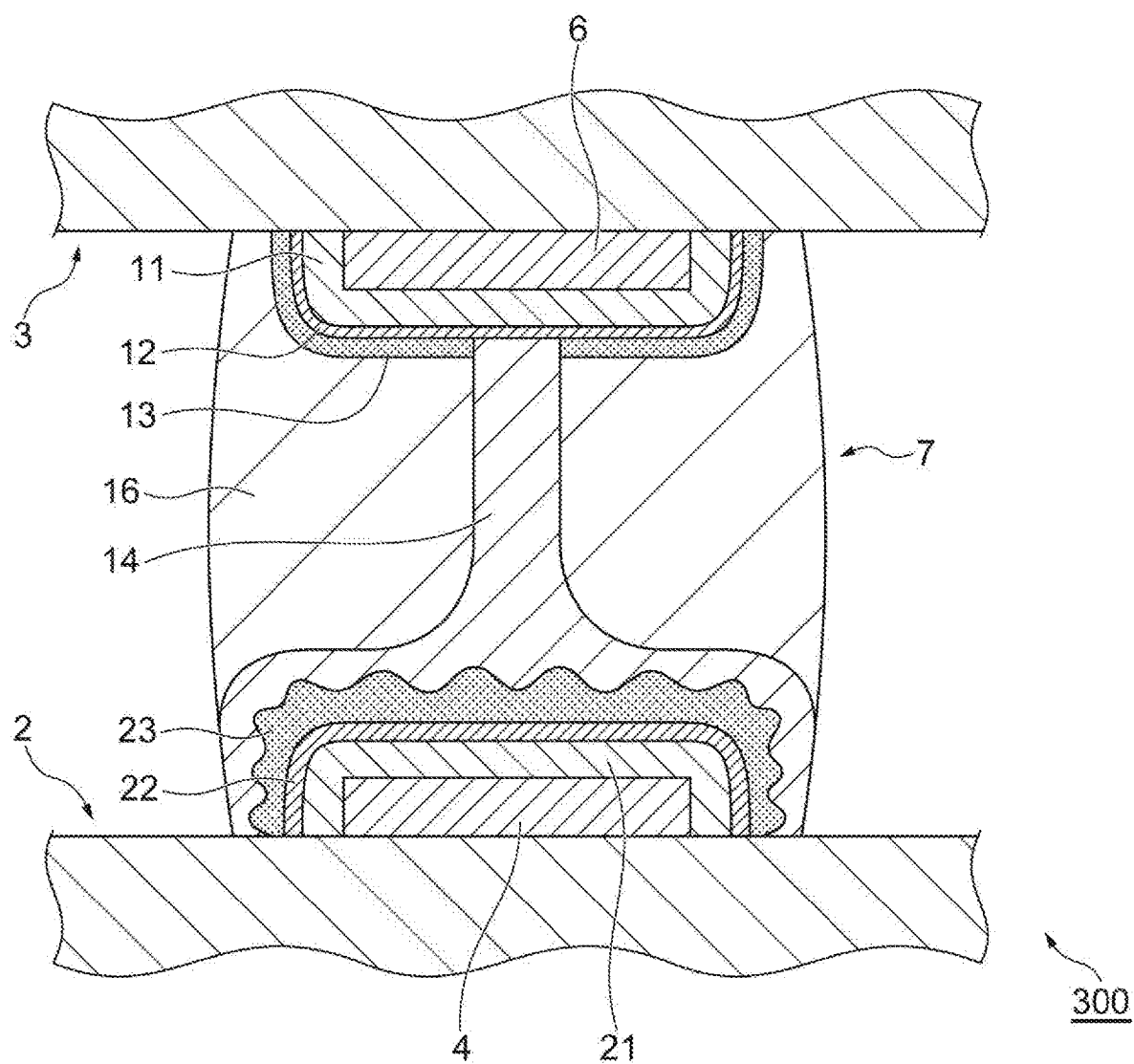
FIG. 9 is a schematic cross-sectional view showing a bonding structure according to a fourth embodiment.

A bonding structure 300 according to a fourth embodiment will be described with reference to FIG. 9. FIG. 9 is a schematic cross-sectional view of the bonding structure according to the fourth embodiment in which Bi is used as the first bonding metal on the light emitting element 3 side and Sn is used as the bonding metal on the substrate 2 side. The bonding layer 7 has a NiP foundational layer 11, a P-containing layer 12, and a NiSn alloy layer 13 in that order from the electrode 6 side to cover the electrode 6 on the light emitting element 3 side. Also, the bonding layer 7 includes a NiP foundational layer 21, a P-containing layer 22, and a NiSn alloy layer 23 in that order from the electrode 4 side to cover the electrode 4 on the substrate 2 side. The NiSn alloy layer 23 is formed radially around the NiP foundational layer 21. That is, the NiSn alloy layer 23 has a locally and largely protruding portion and a recessed portion. Such a radial shape of the NiSn alloy layer 23 is formed by previously annealing the metal layer 42 and the foundational layer 41 of the substrate 2 (refer to FIG. 5D). The P-containing layer 22 is a layer formed by a reaction between a Sn component and a NiP component to form the NiSn alloy layer 23.

The NiSn alloy layer 13 on the light emitting element 3 side is an alloy layer formed by a reaction between a Ni component of the foundational layer 31 of the light emitting element 3 and a Sn component. At this time, the Sn component reacts with the Ni component on the light emitting element 3 side by diffusing the Sn component on the substrate 2 side into the Bi component to the light emitting element 3 side. The Sn component on the light emitting element 3 side is smaller than that on the substrate 2 side. Therefore, the NiSn alloy layer 13 on the light emitting element 3 side is formed to be thinner than the NiSn alloy layer 23 on the substrate 2 side. Further, the P-containing layer 12 on the light emitting element 3 side is also thinner than the P-containing layer 22 on the substrate 2 side. Since the NiSn alloy layer 13 on the light emitting element 3 side is a uniform and thin layer, the following effects can be obtained. When the substrate 2 is a flexible substrate, the alloy layer breaks easily due to an influence of stress applied to a terminal on the substrate 2 side. However, since the NiSn alloy layer 13 is uniform and thin, such breakage can be curbed.

The metal layer is a layer formed substantially of a single metal component. Here, the state in which the metal layer is formed of substantially a single metal component is a state in which the metal component is contained at 95% by mass or more in a unit volume. The bonding layer 7 has at least a metal layer formed of the bonding metal component of one of the first bonding metal component and the second bonding metal component which does not become the alloy layer. Since the NiSn alloy layers 13 and 23 are formed as the alloy layers, the bonding layer 7 has at least the Bi metal layer 16. In the embodiment, the bonding layer 7 also has the Sn metal layer 14 which is a metal layer of a Sn component serving as an alloy layer.

The Sn metal layer 14 and the Bi metal layer 16 are formed for the following reasons. That is, a NiSn alloy layer 43 is present in the Sn metal layer 42 at the time of starting the bonding because the annealing process of the substrate 2 is performed in advance. Therefore, when the bonding is started, a reaction between the Sn component and the Bi component is inhibited by the Ni component diffused in the Sn component. Thus, the Sn component and the Bi component are not mixed uniformly. In this case, a Sn-rich portion partially remains, and that portion becomes the Sn metal layer 14. Further, a Bi-rich portion partially remains, and that portion becomes the Bi metal layer 16.

A narrow gap between the substrate 2 and the light emitting element 3 and a low fluidity of a bonded body may also cause the Sn component and the Bi component to be difficult to mix uniformly. For example, since a distance between the adjacent electrodes 6 in a planar direction is 100 μm or less, the gap between the substrate 2 and the light emitting element 3 may be suppressed to 50 μm or less from the viewpoint of preventing a short circuit.

The light emitting element 3 and the substrate 2 are bonded via the bonding layer 7. Also, the electrodes 6 of the light emitting element 3 and the electrodes 4 of the substrate 2 are electrically connected via the bonding layer 7. The bonding layer 7 contains the first bonding metal component and the second bonding metal component different from the first bonding metal component. As described above, when the bonding layer 7 contains the first bonding metal component and the second bonding metal component which are different from each other, a melting point at the time of bonding can be reduced. Accordingly, the light emitting element 3 and the substrate 2 can be bonded at a low temperature. In this way, the light emitting element 3 and the substrate 2 can be bonded in an appropriate state.

The bonding layer 7 has the NiSn alloy layers 13 and 23. The NiSn alloy layers 13 and 23 are configured of an alloy of the Ni component which is a foundation metal component and the Sn component which is a bonding metal component of one of the first bonding metal component and the second bonding metal component. As described above, the fact that the bonding layer 7 has the NiSn alloy layers 13 and 23 indicates that the Ni component is diffused into the Sn metal layer when the bonding layer 7 is bonded. In this case, mixing of the Sn component and the Bi component is curbed, and the Sn metal layer 14 and the Bi metal layer 16 are easily formed.

In particular, the bonding layer 7 has a pair of alloy layers 13 and 23 on the light emitting element 3 side and the substrate 2 side. This means that at the time of bonding, the Sn component has moved to the light emitting element 3 side which does not have the metal layer 42 of the Sn component, and the NiSn alloy layer 13 has been formed. In this case, the Ni component on the light emitting element 3 side is also diffused into the Sn component, and thus the mixing of the Sn component and the Bi component can be further curbed. Further, on the light emitting element 3 side, instead of forming the eutectic layer by mixing the Sn component and the Bi component, the NiSn alloy layer 13 is formed by the Sn component and the Ni component. Thus, the bonding layer 7 can reduce a proportion of the eutectic layer with a brittle structure.

The bonding structure 300 according to the fourth embodiment was manufactured as Example 4. A foundational layer of NiP having a thickness of 1 μm and a metal layer of Bi having a thickness of 4 μm were formed on an electrode having a size of φ15 μm in a light emitting element by a method called electroless plating. A NiP foundational layer having a thickness of 1 μm and a metal layer of Sn having a thickness of 6 μm were formed on an electrode having a size of 15×20 μm on the substrate by the method called electroless plating. Further, the bump was heated by a formic acid reflow furnace, and thus the annealing process was performed. The light emitting element and the substrate were overlapped at a position of each of the bumps, and pressure was applied while heating was performed at 180° C.

In the fourth embodiment, in each of the bonding structures, the Sn metal layer 14 and the Bi metal layer 16 were confirmed. In addition, the NiSn alloy layer 23 which was diffused radially was confirmed. Further, the NiSn alloy layer 13 on the light emitting element side was confirmed.

Fifth Embodiment

Figure 10:
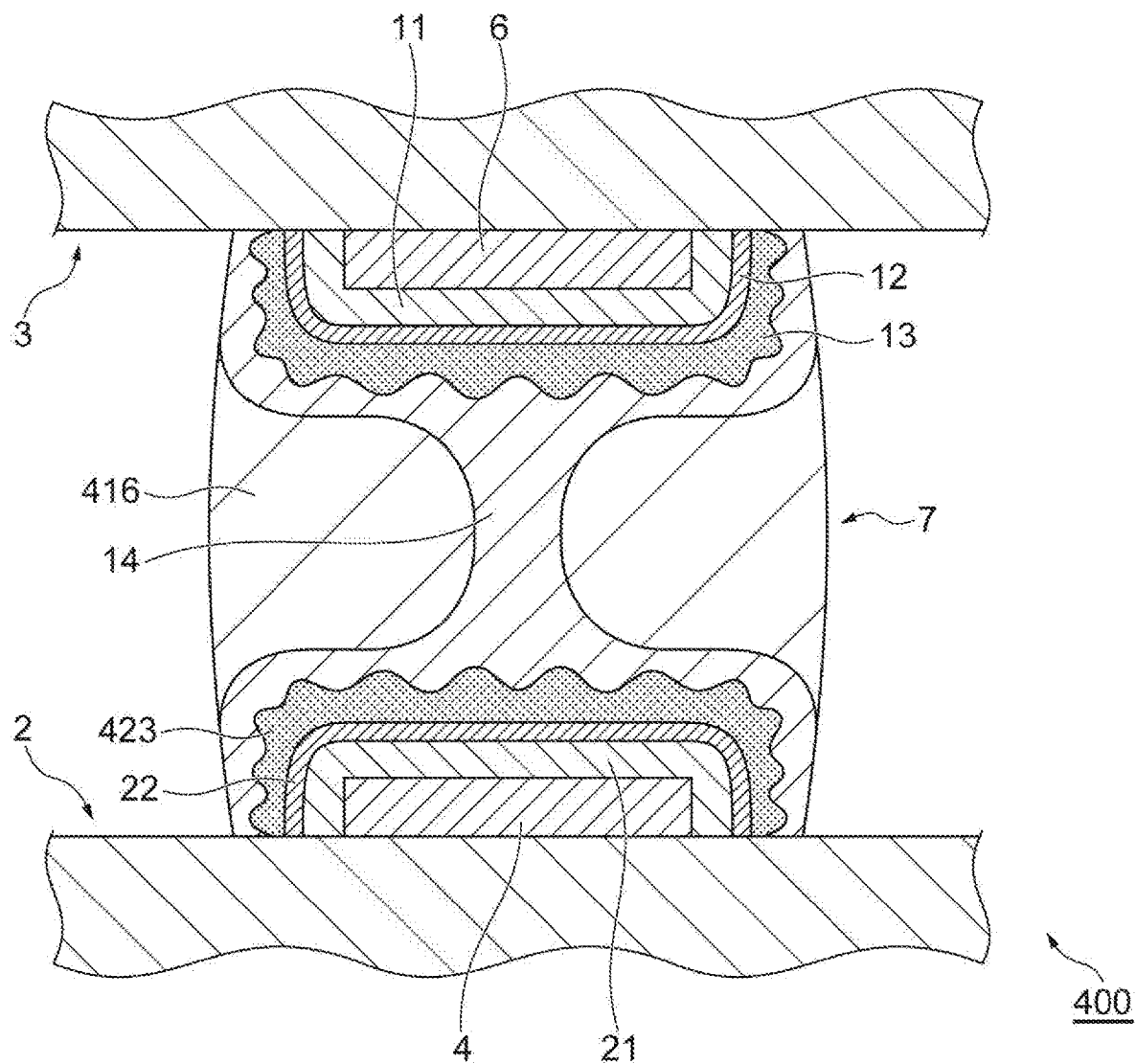
FIG. 10 is a schematic cross-sectional view showing a bonding structure according to a fifth embodiment.

A bonding structure 400 according to a fifth embodiment will be described with reference to FIG. 10. FIG. 10 is a schematic cross-sectional view of the bonding structure according to the fifth embodiment in which Sn is used as the first bonding metal on the light emitting element 3 side and In is used as the bonding metal on the substrate 2 side. The bonding layer 7 has a NiP foundational layer 11, a P-containing layer 12, and a NiSn alloy layer 13 in that order from the electrode 6 side to cover the electrode 6 on the light emitting element 3 side. Also, the bonding layer 7 includes a NiP foundational layer 21, a P-containing layer 22, and a NiIn alloy layer 423 in that order from the electrode 4 side to cover the electrode 4 on the substrate 2 side. The NiSn alloy layer 13 is formed radially around the NiP foundational layer 11. That is, the NiSn alloy layer 13 has a locally and largely protruding portion and a recessed portion. Such a radial shape of the NiSn alloy layer 13 is formed by previously annealing the metal layer 32 and the foundational layer 31 of the light emitting element 3 (refer to FIG. 4D). The NiIn alloy layer 423 is formed radially around the NiP foundational layer 21. That is, the NiIn alloy layer 423 has a locally and largely protruding portion and a recessed portion. Such a radial shape of the NiIn alloy layer 423 is formed by previously annealing the metal layer 42 and the foundational layer 41 of the substrate 2 (refer to FIG. 5D). The P-containing layer 12 is a layer formed by a reaction between a Sn component and a NiP component to form the NiSn alloy layer 13. The P-containing layer 22 is a layer formed by a reaction between an In component and a NiP component to form the NiIn alloy layer 423.

The metal layer is a layer formed substantially of a single metal component. Here, the state in which the metal layer is formed of substantially a single metal component is a state in which the metal component is contained at 95% by mass or more in a unit volume. The bonding layer 7 has at least a metal layer formed of the bonding metal component of one of the first bonding metal component and the second bonding metal component which does not become the alloy layer. Since the NiSn alloy layer 13 and the NiIn alloy layer 423 are formed as the alloy layers, the bonding layer 7 has at least the In metal layer 416. In the embodiment, the bonding layer 7 also has the Sn metal layer 14 which is a metal layer of a Sn component serving as an alloy layer.

The Sn metal layer 14 and the In metal layer 416 are formed for the following reasons. That is, a NiSn alloy layer 33 is present in the Sn metal layer 32 of the light emitting element 3 and a NiIn alloy layer (an alloy layer having the same meaning as the NiSn alloy layer 43 in FIG. 5D) is present in the In metal layer 42 of the substrate 2 at the time of starting the bonding because the annealing process of the light emitting element 3 and the substrate 2 is performed in advance. Therefore, when the bonding is started, a reaction between the Sn component and the In component is inhibited by the Ni component diffused in the Sn component and the In component. Thus, the Sn component and the In component are not mixed uniformly. In this case, an In-rich portion partially remains, and that portion becomes the In metal layer 416.

A narrow gap between the substrate 2 and the light emitting element 3 and a low fluidity of a bonded body may also cause the Sn component and the In component to be difficult to mix uniformly. For example, since a distance between the adjacent electrodes 6 in a planar direction is 100 μm or less, the gap between the substrate 2 and the light emitting element 3 may be suppressed to 50 μm or less from the viewpoint of preventing a short circuit.

The light emitting element 3 and the substrate 2 are bonded via the bonding layer 7. Also, the electrodes 6 of the light emitting element 3 and the electrodes 4 of the substrate 2 are electrically connected via the bonding layer 7. The bonding layer 7 contains the first bonding metal component and the second bonding metal component different from the first bonding metal component. As described above, when the bonding layer 7 contains the first bonding metal component and the second bonding metal component which are different from each other, a melting point at the time of bonding can be reduced. Accordingly, the light emitting element 3 and the substrate 2 can be bonded at a low temperature. In this way, the light emitting element 3 and the substrate 2 can be bonded in an appropriate state.

The bonding layer 7 has the NiSn alloy layer 13 and the NiIn alloy layer 423. Each of the NiSn alloy layer 13 and the NiIn alloy layer 423 is configured of an alloy of the Ni component which is a foundation metal component, the Sn component which is a first bonding metal component, and an In component which is a second bonding metal component. As described above, the fact that the bonding layer 7 has the NiSn alloy layer 13 and the NiIn alloy layer 423 indicates that the Ni component is diffused into the Sn metal layer when the bonding layer 7 is bonded. In this case, mixing of the Sn component and the In component is curbed, and the Sn metal layer 14 and the In metal layer 416 are easily formed.

The bonding structure 400 according to the fifth embodiment was manufactured as Example 5. A foundational layer of NiP having a thickness of 1 μm and a metal layer of Sn having a thickness of 6 μm were formed on an electrode having a size of φ3-15 μm in a light emitting element by a method called electroless plating. A NiP foundational layer having a thickness of 1 μm and a metal layer of In having a thickness of 4 μm were formed on an electrode having a size of 15×20 μm on the substrate by the method called electroless plating. Further, the bumps of the light emitting element and the substrate were heated by a formic acid reflow furnace, and thus the annealing process was performed. The light emitting element and the substrate were overlapped at a position of each of the bumps, and pressure was applied while heating was performed at 150° C.

In the fifth embodiment, in each of the bonding structures, the Sn metal layer 14 and the In metal layer 416 were confirmed. In addition, the NiSn alloy layer 13 which was diffused radially on the light emitting element side was confirmed. Further, the NiIn alloy layer 423 which was diffused radially on the substrate was confirmed.

Sixth Embodiment

Figure 11:
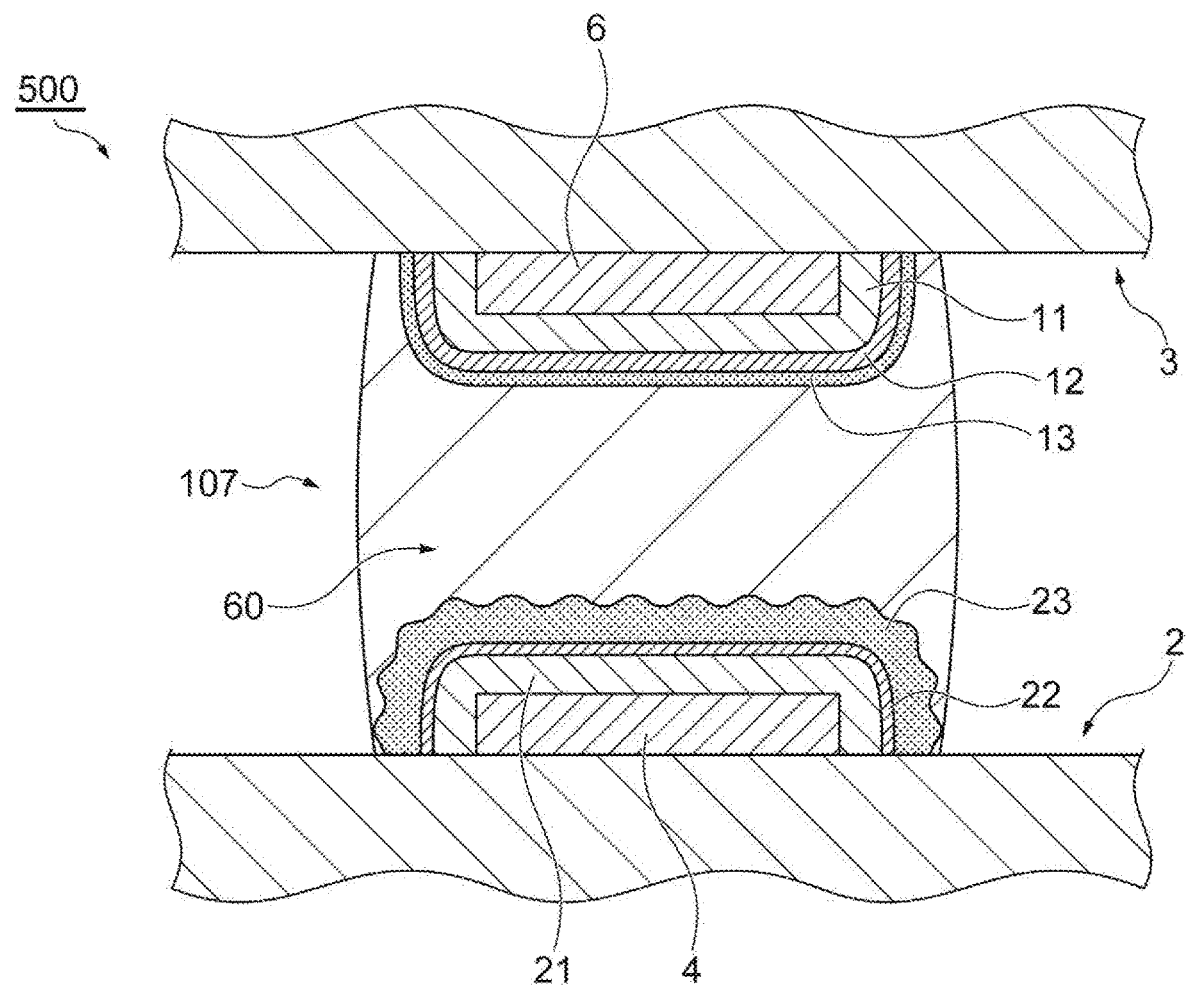
FIG. 11 is a schematic cross-sectional view showing a bonding structure according to a sixth embodiment.

A bonding structure 500 according to a sixth embodiment will be described with reference to FIG. 11. FIG. 11 is a schematic cross-sectional view of the bonding structure according to the sixth embodiment in which Bi is used as the first bonding metal on the light emitting element 3 side and Sn is used as the second bonding metal on the substrate 2 side. The bonding structure 500 of the sixth embodiment is different from the bonding structure 100 of the second embodiment in that the NiSn alloy layer 23 on the substrate 2 side is diffused radially and the NiSn alloy layer 13 on the light emitting element 3 side is not diffused radially. In the description of the sixth embodiment, parts common to the second embodiment will be omitted. A bonding layer 107 has a NiP foundational layer 11, a P-containing layer 12, and a NiSn alloy layer 13 in that order from the electrode 6 side to cover the electrodes 6 on the light emitting element 3 side. Further, the bonding layer 107 includes a NiP foundational layer 21, a P-containing layer 22, and a NiSn alloy layer 23 in that order from the electrode 4 side to cover the electrodes 4 on the substrate 2 side. Furthermore, the bonding layer 107 has a SnBi eutectic layer 60 between the NiSn alloy layer 13 on the light emitting element 3 side and the NiSn alloy layer 23 on the substrate 2 side.

Such a SnBi eutectic layer 60 is formed by bonding the light emitting element 3 and the substrate 2 without performing an annealing process as shown in FIG. 5D when the bumps 8 of the substrate 2 are formed. That is, as shown in FIG. 5C, in a state in which the alloy layer 43 is not present in the metal layer 42 of Sn, the bumps 9 of the light emitting element 3 and the bumps 8 of the substrate 2 are bonded. In this case, diffusivity of the Ni component to the Sn component during bonding is lower than that of the fourth embodiment in which the alloy layer 43 is present beforehand. Therefore, the Sn component and the Bi component are mixed, and the SnBi eutectic layer 60 is formed.

Since the SnBi eutectic layer 60 is formed, the Sn component mixed with the Bi component also moves to the light emitting element 3 side. On the other hand, an alloying reaction does not proceed between the Bi component and the NiP foundational layer 11. Therefore, the alloying reaction proceeds between the NiP foundational layer 11 on the light emitting element 3 side and the Sn component. The NiSn alloy layer 13 and the P-containing layer 12 are formed to cover the NiP foundational layer 11 on the light emitting element 3 side. Also in the bonding structure 500 according to the sixth embodiment, the NiSn alloy layer 13 on the light emitting element 3 side is a uniform and thin layer as compared with the NiSn alloy layer 23 on the substrate 2 side. This is because an alloy layer of Ni and Sn is formed after Bi is replaced with Sn.

As described above, the bonding structure 500 is a bonding structure 500 which bonds the light emitting element 3 and the substrate 2 and includes the electrodes 6 formed on the light emitting element 3, the electrodes 4 formed on the substrate 2, and the bonding layer 107 which bonds the electrodes 6 and the electrodes 4. The bonding layer 107 contains a first bonding metal component (here, a Bi component) and a second bonding metal component (here, a Sn component) different from the first bonding metal component.

The bonding layer 107 has the NiSn alloy layers 13 and 23. The NiSn alloy layers 13 and 23 are configured of an alloy of the Ni component which is a foundation metal component and the Sn component which is a bonding metal component of one of the first bonding metal component and the second bonding metal component. The bonding layer 107 can reduce a proportion of the eutectic layer with a brittle structure by forming the NiSn alloy layers 13 and 23 in this manner. In particular, the bonding layer 107 has a pair of alloy layers 13 and 23 on the light emitting element 3 side and the substrate 2 side. This means that at the time of bonding, the Sn component has moved to the light emitting element 3 side which does not have the metal layer 42 of the Sn component, and the NiSn alloy layer 13 has been formed. In this way, on the light emitting element 3 side, instead of forming the eutectic layer by mixing the Sn component and the Bi component, the NiSn alloy layer 13 is formed of the Sn component and the Ni component. Thus, the bonding layer 107 can reduce a proportion of the eutectic layer with a brittle structure.

The bonding layer 107 has the SnBi eutectic layer 60 in which the Sn component and the Bi component are mixed.

Seventh Embodiment

Figure 12:
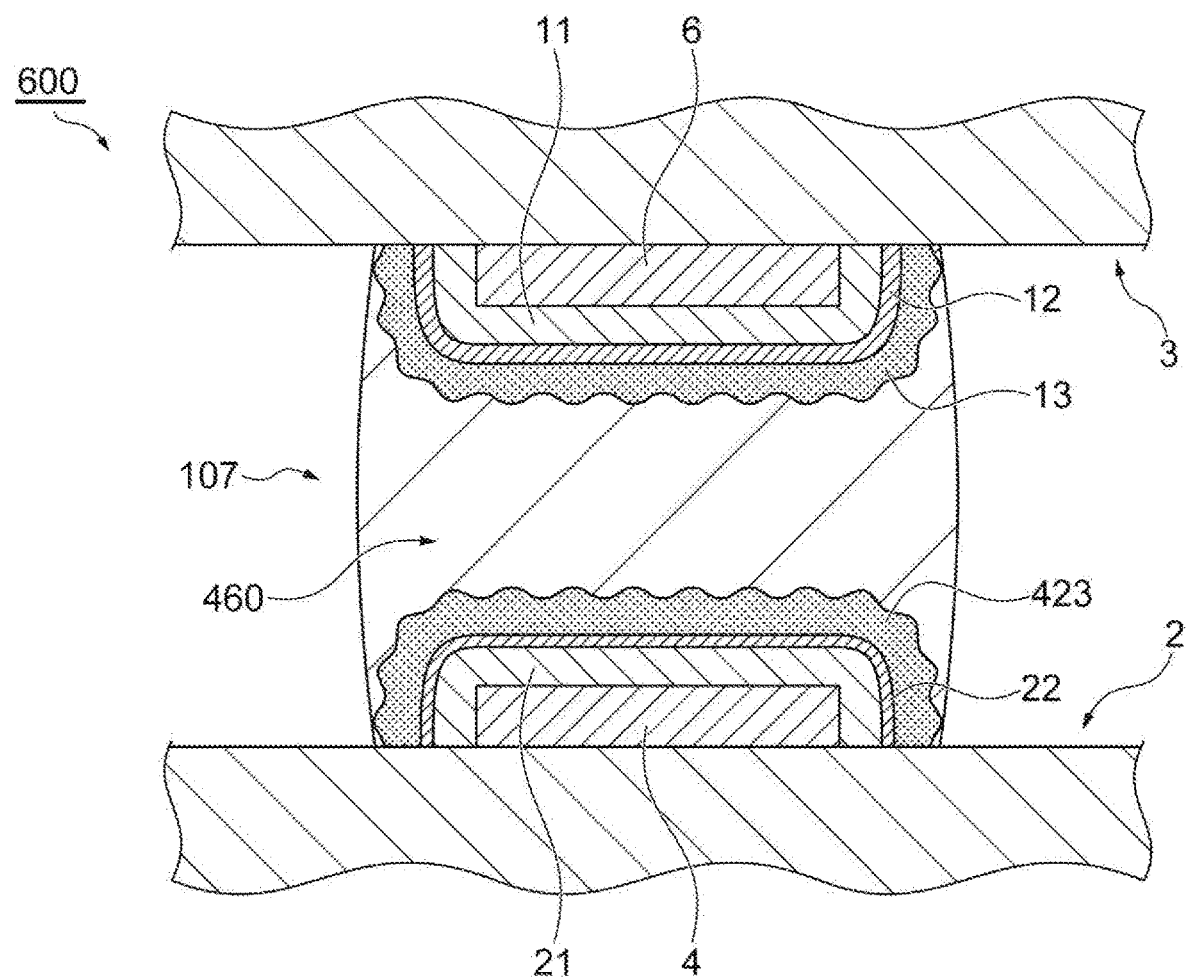
FIG. 12 is a schematic cross-sectional view showing a bonding structure according to a seventh embodiment.

A bonding structure 600 according to a seventh embodiment will be described with reference to FIG. 12. FIG. 12 is a schematic cross-sectional view of a bonding structure according to the seventh embodiment in which Sn is used as the first bonding metal on the light emitting element 3 side and In is used as the second bonding metal on the substrate 2 side. The bonding structure 600 according to the seventh embodiment is different from the bonding structure 100 according to the second embodiment in that the NiSn alloy layer 13 on the light emitting element 3 side is radially diffused, and a NiIn alloy layer 423 on the substrate 2 side is radially diffused. In the description of the seventh embodiment, parts common to the second embodiment will be omitted. A bonding layer 107 has a NiP foundational layer 11, a P-containing layer 12, and a NiSn alloy layer 13 in that order from the electrode 6 side to cover the electrodes 6 on the light emitting element 3 side. Further, the bonding layer 107 includes a NiP foundational layer 21, a P-containing layer 22, and the NiIn alloy layer 423 in that order from the electrode 4 side to cover the electrodes 4 on the substrate 2 side. Furthermore, the bonding layer 107 has a SnIn eutectic layer 460 between the NiSn alloy layer 13 on the light emitting element 3 side and the NiIn alloy layer 423 on the substrate 2 side.

The SnIn eutectic layer 460 is a layer in which a Sn component and an In component are mixed. At the time of bonding, the Sn component and the In component are substantially uniformly mixed with each other, and thus the SnIn eutectic layer 460 is formed. A melting point of the SnIn eutectic layer 460 is lower than that of each of the Sn metal layer 14 and the In metal layer 416 (refer to FIG. 10).

Such a SnIn eutectic layer 460 is formed by bonding the light emitting element 3 and the substrate 2 without performing an annealing process as shown in FIGS. 4D and 5D when the bumps 9 of the light emitting element 3 and the bumps 8 of the substrate 2 are formed. That is, as shown in FIGS. 4C and 5D, in a state in which the NiSn alloy layer 33 and the alloy layer 43 are not present in the metal layers 32 and 42 of Sn, the bumps 9 of the light emitting element 3 and the bumps 8 of the substrate 2 are bonded. In this case, diffusivity of the Ni component to the Sn component during bonding is lower than that of the fifth embodiment in which the NiSn alloy layer 33 and the alloy layer 43 are present beforehand. Therefore, the Sn component and the In component are mixed, and the SnIn eutectic layer 460 is formed.

Since the SnIn eutectic layer 460 is formed, the Sn component mixed with the In component also moves to the substrate 2 side. The In component mixed with the Sn component also moves to the light emitting element 3 side. The alloying reaction proceeds between the NiP foundational layer 21 on the substrate 2 side and the In component. The NiIn alloy layer 423 and the P-containing layer 22 are formed to cover the NiP foundational layer 21 on the substrate 2 side. In the bonding structure 600 according to the seventh embodiment, the NiIn alloy layer 423 has a shape which is diffused radially, like the NiSn alloy layer 13 on the light emitting element 3 side.

As described above, the bonding structure 600 is a bonding structure 600 which bonds the light emitting element 3 and the substrate 2 and includes the electrodes 6 formed on the light emitting element 3, the electrodes 4 formed on the substrate 2, and the bonding layer 107 which bonds the electrodes 6 and the electrodes 4. The bonding layer 107 contains a first bonding metal component (here, a Sn component) and a second bonding metal component (here, an In component) different from the first bonding metal component.

The bonding layer 107 has the NiSn alloy layer 13 and the NiIn alloy layer 423. The NiSn alloy layer 13 and the NiIn alloy layer 423 are configured of an alloy of the Ni component which is a foundation metal component, the Sn component which is the first bonding metal component and the In component which is the second bonding metal component. The bonding layer 107 can reduce a proportion of the eutectic layer with a brittle structure by forming the NiSn alloy layer 13 and the NiIn alloy layer 423 in this manner.

The bonding layer 107 has the SnIn eutectic layer 460 in which the Sn component and the In component are mixed.

Eight Embodiment

Figure 13:
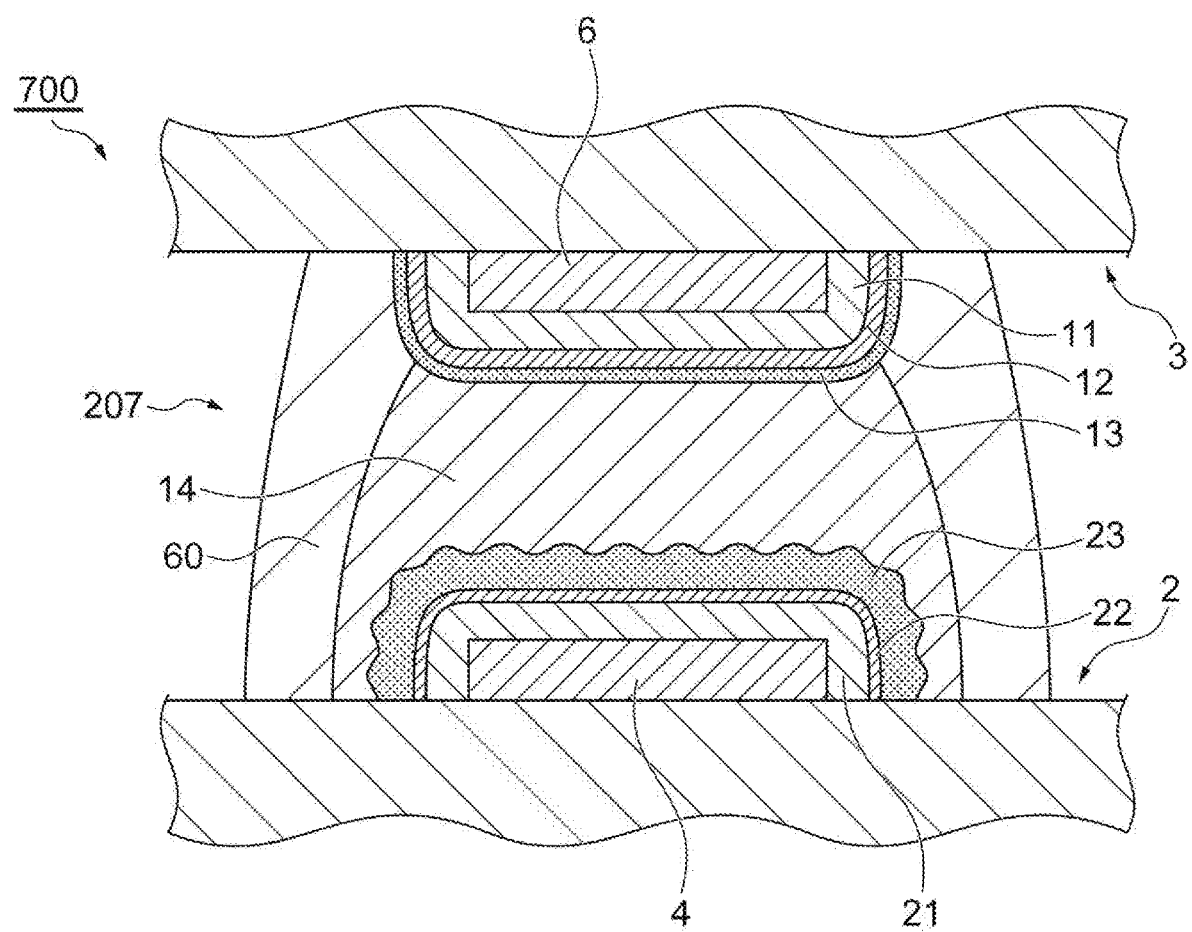
FIG. 13 is a schematic cross-sectional view showing a bonding structure according to an eighth embodiment.

A bonding structure 700 according to an eighth embodiment will be described with reference to FIG. 13. FIG. 13 is a schematic cross-sectional view of the bonding structure 700 according to the eighth embodiment in which Bi is used as the first bonding metal on the light emitting element 3 side and Sn is used as the second bonding metal on the substrate 2 side. The bonding structure 700 according to the eighth embodiment is different from the bonding structure 200 according to the third embodiment in that the NiSn alloy layer 23 on the substrate 2 side is diffused radially, and the NiSn alloy layer 13 on the light emitting element 3 side is not diffused radially. In the description of the eighth embodiment, parts common to the third embodiment will be omitted. A bonding layer 207 includes a NiP foundational layer 11, a P-containing layer 12, and a NiSn alloy layer 13 in that order from the electrode 6 side to cover the electrode 6 on the light emitting element 3 side. Further, the bonding layer 207 includes a NiP foundational layer 21, a P-containing layer 22, and a NiSn alloy layer 23 in that order from the electrode 4 side to cover the electrode 4 on the substrate 2 side. In addition, the bonding layer 207 has a Sn metal layer 14 and a SnBi eutectic layer 60 between the NiSn alloy layer 13 on the light emitting element 3 side and the NiSn alloy layer 23 on the substrate 2 side.

The Sn metal layer 14 is mainly formed in a region in which the electrode 4 and the electrode 6 face each other. Then, the SnBi eutectic layer 60 is formed around the Sn metal layer 14. That is, the SnBi eutectic layer 60 is disposed to be pushed out to an outer peripheral portion of the bonding layer 207 by the Sn metal layer 14. In the embodiment shown in FIG. 13, since the Sn component is dominant, the Sn metal layer 14 is formed. However, according to a relationship between amounts of the Sn component and the Bi component, the Bi metal layer 16 may be formed instead of the Sn metal layer 14, or both the Sn metal layer 14 and the Bi metal layer 16 may be formed.

Such a bonding layer 207 is formed by increasing a pressing pressure of the light emitting element 3 against the substrate 2 with respect to the manufacturing conditions of the bonding structure 300 according to the fourth embodiment. The pressing load is the same as in the third embodiment.

As described above, the bonding structure 700 is a bonding structure 700 which bonds the light emitting element 3 and the substrate 2 and includes the electrodes 6 formed on the light emitting element 3, the electrodes 4 formed on the substrate 2, and the bonding layer 207 which bonds the electrodes 6 and the electrodes 4. The bonding layer 207 contains a first bonding metal component (here, a Bi component) and a second bonding metal component (here, a Sn component) different from the first bonding metal component.

The bonding layer 207 has the NiSn alloy layers 13 and 23. The NiSn alloy layers 13 and 23 are configured of an alloy of the Ni component which is a foundation metal component and the Sn component which is a bonding metal component of one of the first bonding metal component and the second bonding metal component. Also in the bonding structure 700 according to the eighth embodiment, the NiSn alloy layer 13 on the light emitting element 3 side is a uniform and thin layer as compared with the NiSn alloy layer 23 on the substrate 2 side.

Ninth Embodiment

Figure 14:
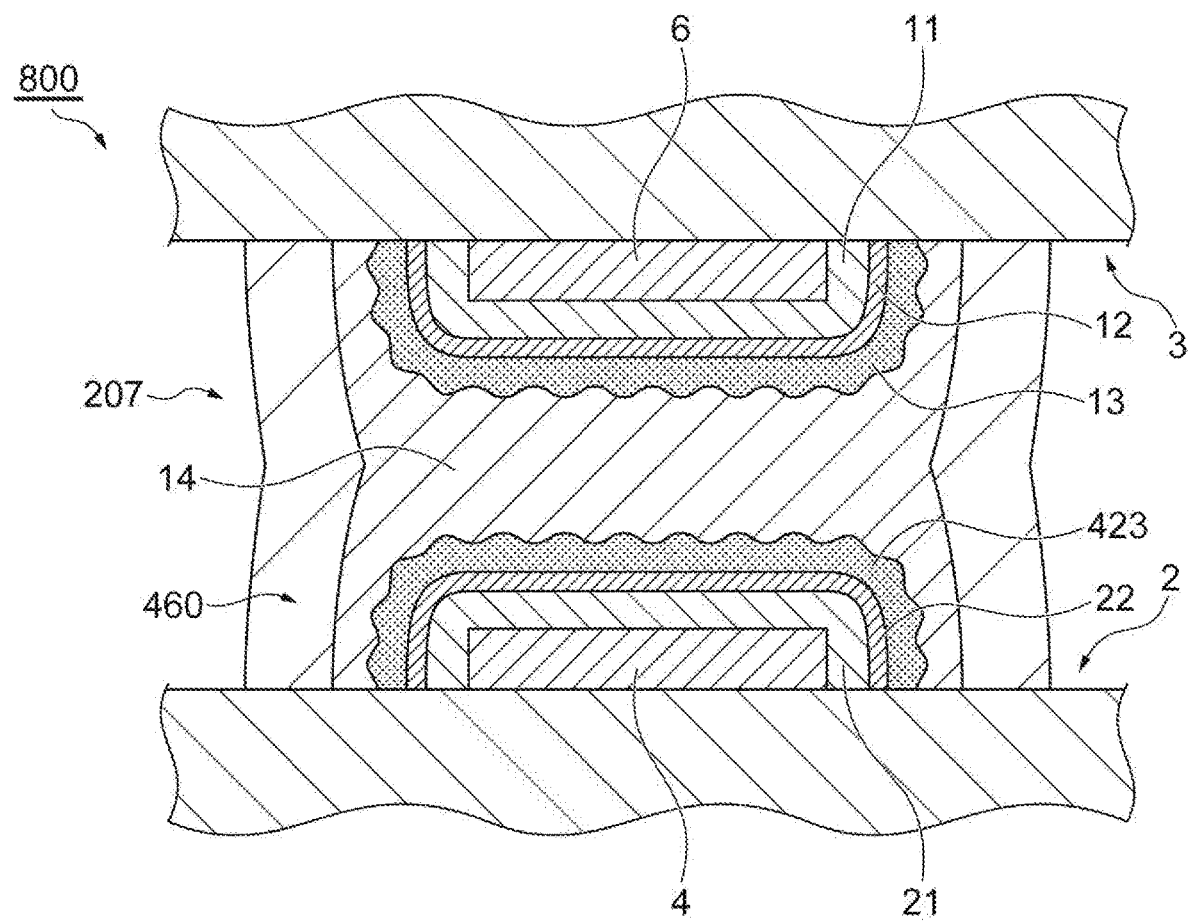
FIG. 14 is a schematic cross-sectional view showing a bonding structure according to a ninth embodiment.

A bonding structure 800 according to a ninth embodiment will be described with reference to FIG. 14. FIG. 14 is a schematic cross-sectional view of the bonding structure 800 according to the ninth embodiment in which Sn is used as the first bonding metal on the light emitting element 3 side and In is used as the second bonding metal on the substrate 2 side. The bonding structure 800 according to the ninth embodiment is different from the bonding structure 200 according to the third embodiment in that the NiSn alloy layer 13 on the light emitting element 3 side is radially diffused, and the NiIn alloy layer 423 on the substrate 2 side is radially diffused. In the description of the ninth embodiment, parts common to the third embodiment will be omitted. A bonding layer 207 includes a NiP foundational layer 11, a P-containing layer 12, and a NiSn alloy layer 13 in that order from the electrode 6 side to cover the electrode 6 on the light emitting element 3 side. Further, the bonding layer 207 includes a NiP foundational layer 21, a P-containing layer 22, and a NiIn alloy layer 423 in that order from the electrode 4 side to cover the electrode 4 on the substrate 2 side. In addition, the bonding layer 207 has a Sn metal layer 14 and a SnIn eutectic layer 460 between the NiSn alloy layer 13 on the light emitting element 3 side and the NiIn alloy layer 423 on the substrate 2 side.

The Sn metal layer 14 is mainly formed in a region in which the electrode 4 and the electrode 6 face each other. Then, the SnIn eutectic layer 460 is formed around the Sn metal layer 14. That is, the SnIn eutectic layer 460 is disposed to be pushed out to an outer peripheral portion of the bonding layer 207 by the Sn metal layer 14. In the embodiment shown in FIG. 14, since the Sn component is dominant, the Sn metal layer 14 is formed. However, according to a relationship between amounts of the Sn component and the Bi component, the Bi metal layer 16 may be formed instead of the Sn metal layer 14, or both the Sn metal layer 14 and the Bi metal layer 16 may be formed.

Such a bonding layer 207 is formed by increasing a pressing pressure of the light emitting element 3 against the substrate 2 with respect to the manufacturing conditions of the bonding structure 400 according to the fifth embodiment. The pressing load is the same as in the third embodiment.

As described above, the bonding structure 800 is a bonding structure 800 which bonds the light emitting element 3 and the substrate 2 and includes the electrodes 6 formed on the light emitting element 3, the electrodes 4 formed on the substrate 2, and the bonding layer 207 which bonds the electrodes 6 and the electrodes 4. The bonding layer 207 contains a first bonding metal component (here, a Sn component) and a second bonding metal component (here, an In component) different from the first bonding metal component.

The bonding layer 207 has the NiSn alloy layer 13 and the NiIn alloy layer 423. The NiSn alloy layer 13 and the NiIn alloy layer 423 are configured of an alloy of the Ni component which is a foundation metal component, the Sn component which is the first bonding metal component and the In component which is the second bonding metal component. Also in the bonding structure 800 according to the ninth embodiment, both the NiSn alloy layer 13 and the NiIn alloy layer 423 are diffused radially.

The bonding layer 207 has a metal layer formed of a substantially single metal component, and a eutectic layer in which the first bonding metal component and the second bonding metal component are mixed. The metal layer is formed as the Sn metal layer 14 by the Sn component which is a metal component of at least one of the first bonding metal component and the second bonding metal component. The SnIn eutectic layer 460 is formed around the Sn metal layer 14. In this case, in the bonding layer 207, the SnIn eutectic layer 460 which has a low melting point and is brittle can be disposed on the outer peripheral side, and the Sn metal layer 14 which has a high melting point and high strength can be disposed on the center side as a main body portion. As described above, since the bonding layer 207 has the Sn metal layer 14 as the main body portion, when the reflow is performed again for repair, mounting of other components, or the like, remelting can be curbed, and reliability of the structure can be increased.

EXPLANATION OF REFERENCES 1, 100, 200, 300, 400, 500, 600, 700, 800 Bonding structure
2 Substrate
3 Light emitting element
4 Electrode (second electrode)
6 Electrode (first electrode)
7, 107, 207 Bonding layer
8, 9 Bump
11 Nip foundational layer (first foundational layer)
12, 22 P-containing layer
21 NiP foundational layer (second foundational layer)
13 NiSn alloy layer (alloy layer, first alloy layer)
23 NiSn alloy layer (alloy layer, second alloy layer)
14 Sn metal layer (metal layer)
16Bi metal layer (metal layer)
31, 41 Foundational layer
32, 42 Metal layer
33, 43 Alloy layer
60 SnBi eutectic layer (eutectic layer)
416 In alloy layer (metal layer)
423 NiIn alloy layer (alloy layer, second alloy layer)
460 SnIn eutectic layer (eutectic layer)

What is claimed is:

1. A bonding structure which bonds a light emitting element and a substrate, the bonding structure comprising:
   a first electrode disposed on the light emitting element;
   a second electrode disposed on the substrate; and
   a bonding layer which bonds the first electrode and the second electrode, the bonding layer containing:
      a layer which contains:
         a first bonding metal component; and
         a second bonding metal component different from the first bonding metal component;

a foundational layer; and an alloy layer on at least one of a light emitting element side and a substrate side, the alloy layer being of an alloy of a foundation metal component of the foundational layer and a bonding metal component of one of the first bonding metal component and the second bonding metal component.

2. The bonding structure according to claim 1, wherein the bonding layer has a pair of alloy layers on the light emitting element side and the substrate side.

3. The bonding structure according to claim 1, wherein the bonding layer has, as the layer, a eutectic layer in which the first bonding metal component and the second bonding metal component are mixed.

4. The bonding structure according to claim 1, wherein the bonding layer has a first foundational layer and a first alloy layer disposed on a light emitting element side, and a second foundational layer and a second alloy layer disposed on a substrate side, the first alloy layer is of an alloy of a first foundation metal component of the first foundational layer and a bonding metal component of one of the first bonding metal component and the second bonding metal component, the second alloy layer is of an alloy of a second foundation metal component of the second foundational layer and the one bonding metal component, and one of the first alloy layer and the second alloy layer is thinner than the other alloy layer.

5. The bonding structure according to claim 1, wherein the bonding layer has a first foundational layer and a first alloy layer disposed on a light emitting element side, and a second foundational layer and a second alloy layer disposed on a substrate side, the first alloy layer is of an alloy of a first foundation metal component of the first foundational layer and a bonding metal component of one of the first bonding metal component and the second bonding metal component, the second alloy layer is of an alloy of a second foundation metal component of the second foundational layer and the one bonding metal component, and the first alloy layer and the second alloy layer are disposed radially from the first foundational layer and the second foundational layer.

6. A bonding structure which bonds a light emitting element and a substrate, the bonding structure comprising:

a first electrode disposed on the light emitting element;

a second electrode disposed on the substrate; and a bonding layer which bonds the first electrode and the second electrode, the bonding layer containing:

a layer which contains:

a first bonding metal component; and a second bonding metal component different from the first bonding metal component;

an alloy layer of an alloy of a foundation metal component and a bonding metal component of one of the first bonding metal component and the second bonding metal component; and a metal layer substantially of a single metal component, the metal layer being of a bonding metal component of the other one of the first bonding metal component and the second bonding metal component.

7. A bonding structure which bonds a light emitting element and a substrate, the bonding structure comprising:

a first electrode disposed on the light emitting element;

a second electrode disposed on the substrate; and a bonding layer which bonds the first electrode and the second electrode, the bonding layer containing:

a eutectic layer which contains:

a first bonding metal component; and a second bonding metal component different from the first bonding metal component, the second bonding metal and first bonding metal being mixed; and a metal layer substantially of a single metal component, the metal layer being of a metal component of at least one of the first bonding metal component and the second bonding metal component, wherein the eutectic layer is formed disposed around the metal layer.

* * * * *